(12) United States Patent
Kim et al.

(10) Patent No.: US 12,519,086 B2
(45) Date of Patent: Jan. 6, 2026

(54) SEMICONDUCTOR PACKAGE WITH REDISTRIBUTION SUBSTRATE

(71) Applicant: SAMSUNG ELECTRONICS CO., LTD., Suwon-si (KR)

(72) Inventors: Dongkyu Kim, Anyang-si (KR); Minjung Kim, Cheonan-si (KR); Kyoung Lim Suk, Suwon-si (KR); Seokhyun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 697 days.

(21) Appl. No.: 17/806,907

(22) Filed: Jun. 14, 2022

(65) Prior Publication Data

US 2023/0065366 A1 Mar. 2, 2023

(30) Foreign Application Priority Data

Aug. 27, 2021 (KR) ........................ 10-2021-0113934

(51) Int. Cl.
*H01L 25/065* (2023.01)
*H01L 23/00* (2006.01)
(Continued)

(52) U.S. Cl.
CPC ...... *H01L 25/0657* (2013.01); *H01L 23/3128* (2013.01); *H01L 23/481* (2013.01);
(Continued)

(58) Field of Classification Search
CPC ... H01L 25/0657; H01L 25/50; H01L 25/105; H01L 25/18; H01L 23/3128; H01L 23/481; H01L 23/49816; H01L 23/3135; H01L 23/50; H01L 24/16; H01L 24/13; H01L 21/568; H01L 21/6835; H01L 21/4857; H01L 2224/16235; H01L 2221/68345;
(Continued)

(56) References Cited

U.S. PATENT DOCUMENTS 9,679,882 B2  6/2017  Tung et al.
9,754,918 B2  9/2017  Yu et al.
(Continued)

FOREIGN PATENT DOCUMENTS

KR  10-2020-0025477 A  3/2020
KR  10-2023-0030103     3/2023

*Primary Examiner* — Ajay Ojha
(74) *Attorney, Agent, or Firm* — Morgan, Lewis & Bockius LLP

(57) ABSTRACT

A semiconductor package includes a first redistribution substrate, a passive device mounted on a bottom surface of the first redistribution substrate, a first semiconductor chip disposed on a top surface of the first redistribution substrate, the first semiconductor chip including a through via disposed therein, a second semiconductor chip disposed on the first semiconductor chip, and a conductive post disposed between the top surface of the first redistribution substrate and a bottom surface of the second semiconductor chip and spaced apart from the first semiconductor chip. The conductive post is connected to the first redistribution substrate and to the second semiconductor chip. The conductive post overlaps with at least a portion of the passive device in a vertical direction normal to the top surface of the first redistribution substrate.

20 Claims, 21 Drawing Sheets

(51) Int. Cl.
   *H01L 23/31*      (2006.01)
   *H01L 23/48*      (2006.01)
   *H01L 23/498*     (2006.01)

(52) U.S. Cl.
   CPC ........ *H01L 23/49816* (2013.01); *H01L 24/16* (2013.01); *H01L 2224/16235* (2013.01)

(58) Field of Classification Search
   CPC . H01L 2225/06513; H01L 2225/06524; H01L 2225/06541; H01L 2225/06548; H01L 2225/06568; H01L 2225/1035; H01L 2225/1041; H01L 2225/1058; H01L 2225/107; H01L 2225/1094
   See application file for complete search history.

(56) References Cited

U.S. PATENT DOCUMENTS

| | | | |
|---|---|---|---|
| 9,991,190 | B2 | 6/2018 | Huang et al. |
| 10,049,964 | B2 | 8/2018 | Shim et al. |
| 10,236,209 | B2 | 3/2019 | Sharan et al. |
| 10,418,298 | B2 | 9/2019 | Lin |
| 10,453,799 | B2 | 10/2019 | Kulkarni et al. |
| 10,770,416 | B2 | 9/2020 | Kim et al. |
| 2018/0061813 | A1* | 3/2018 | Hsieh ................. H01L 23/28 |
| 2019/0027446 | A1* | 1/2019 | Cheng ................ H01L 23/5384 |
| 2019/0131273 | A1* | 5/2019 | Chen .................. H01L 24/19 |
| 2020/0212020 | A1 | 7/2020 | Zhang et al. |
| 2020/0273800 | A1 | 8/2020 | Kim et al. |
| 2020/0343223 | A1* | 10/2020 | Chen .................. H01L 21/486 |
| 2020/0364600 | A1* | 11/2020 | Elsherbini ........... H01L 23/5385 |
| 2020/0381357 | A1* | 12/2020 | Wang ................ H01L 23/53238 |
| 2021/0305162 | A1* | 9/2021 | Ganesan ............. H01L 23/5386 |
| 2023/0065378 | A1 | 3/2023 | Kim et al. |

* cited by examiner

SEMICONDUCTOR PACKAGE WITH REDISTRIBUTION SUBSTRATE

CROSS-REFERENCE TO RELATED APPLICATIONS

This U.S. non-provisional patent application claims priority under 35 U.S.C. § 119 to Korean Patent Application No. 10-2021-0113934, filed on Aug. 27, 2021, in the Korean Intellectual Property Office, the disclosure of which is incorporated by reference herein.

TECHNICAL FIELD

The present disclosure relates to a semiconductor package and, more particularly, to a semiconductor package including a redistribution substrate.

DISCUSSION OF THE RELATED ART

Electronic devices rely on integrated circuits to provide base functionality, such as processing, data storage, power distribution, and the like. To provide increase utilization of space, an integrated circuit chip may be implemented in the form of a semiconductor package. In a typical semiconductor package, a semiconductor chip may be mounted on a printed circuit board and may be electrically connected to the printed circuit board through bonding wires or bumps. Various techniques for increased reliability, higher integration density, and miniaturization of semiconductor packages have been studied with the development of the electronic industry.

SUMMARY

Embodiments of the inventive concepts provide a semiconductor package with increased reliability and power integrity.

A semiconductor package according to the present disclosure includes a first redistribution substrate, a passive device mounted on a bottom surface of the first redistribution substrate, a first semiconductor chip disposed on a top surface of the first redistribution substrate, the first semiconductor chip including a through via disposed therein, a second semiconductor chip disposed on the first semiconductor chip, and a conductive post disposed between the top surface of the first redistribution substrate and a bottom surface of the second semiconductor chip and spaced apart (e.g., laterally spaced apart) from the first semiconductor chip. The conductive post is connected to the first redistribution substrate and the second semiconductor chip. The conductive post vertically overlaps with at least a portion of the passive device.

A semiconductor package according to the present disclosure includes a first redistribution substrate having a top surface and a bottom surface opposite to the top surface, a passive device disposed on the bottom surface of the first redistribution substrate, a first semiconductor chip disposed on the top surface of the first redistribution substrate, the first semiconductor chip comprising a through via disposed therein, a conductive post disposed on the top surface of the first redistribution substrate and spaced apart (e.g., laterally spaced apart) from the first semiconductor chip, and a second semiconductor chip disposed on a top surface of the first semiconductor chip and a on top surface of the conductive post, where the second semiconductor chip is connected to the through via and the conductive post. The conductive post is electrically connected to the passive device through the first redistribution substrate. A width of the conductive post is greater than a width of the through via.

A semiconductor package according to the present disclosure includes a first redistribution substrate including a first insulating layer, a first seed pattern, and a first conductive pattern on the first seed pattern, the first insulating layer including a photosensitive polymer, a solder ball disposed on a bottom surface of the first redistribution substrate, a passive device disposed on the bottom surface of the first redistribution substrate and spaced apart (e.g., laterally spaced apart) from the solder ball, a first semiconductor chip provided on a top surface of the first redistribution substrate, the first semiconductor chip comprising through vias disposed therein, a conductive post disposed on the top surface of the first redistribution substrate and spaced apart from the first semiconductor chip, a second semiconductor chip disposed on a top surface of the first semiconductor chip and on a top surface of the conductive post and connected to the through vias and the conductive post, a first molding layer disposed on a bottom surface of the second semiconductor chip and at least partially covering a side surface of the first semiconductor chip and a side surface of the conductive post, a connection structure disposed on the top surface of the first redistribution substrate and laterally spaced apart from the first semiconductor chip, the conductive post, the first molding layer, and the second semiconductor chip, and a second molding layer disposed on the top surface of the first redistribution substrate and at least partially covering a side surface of the connection structure, the first molding layer, the second semiconductor chip.

DETAILED DESCRIPTION

Figure 1A:
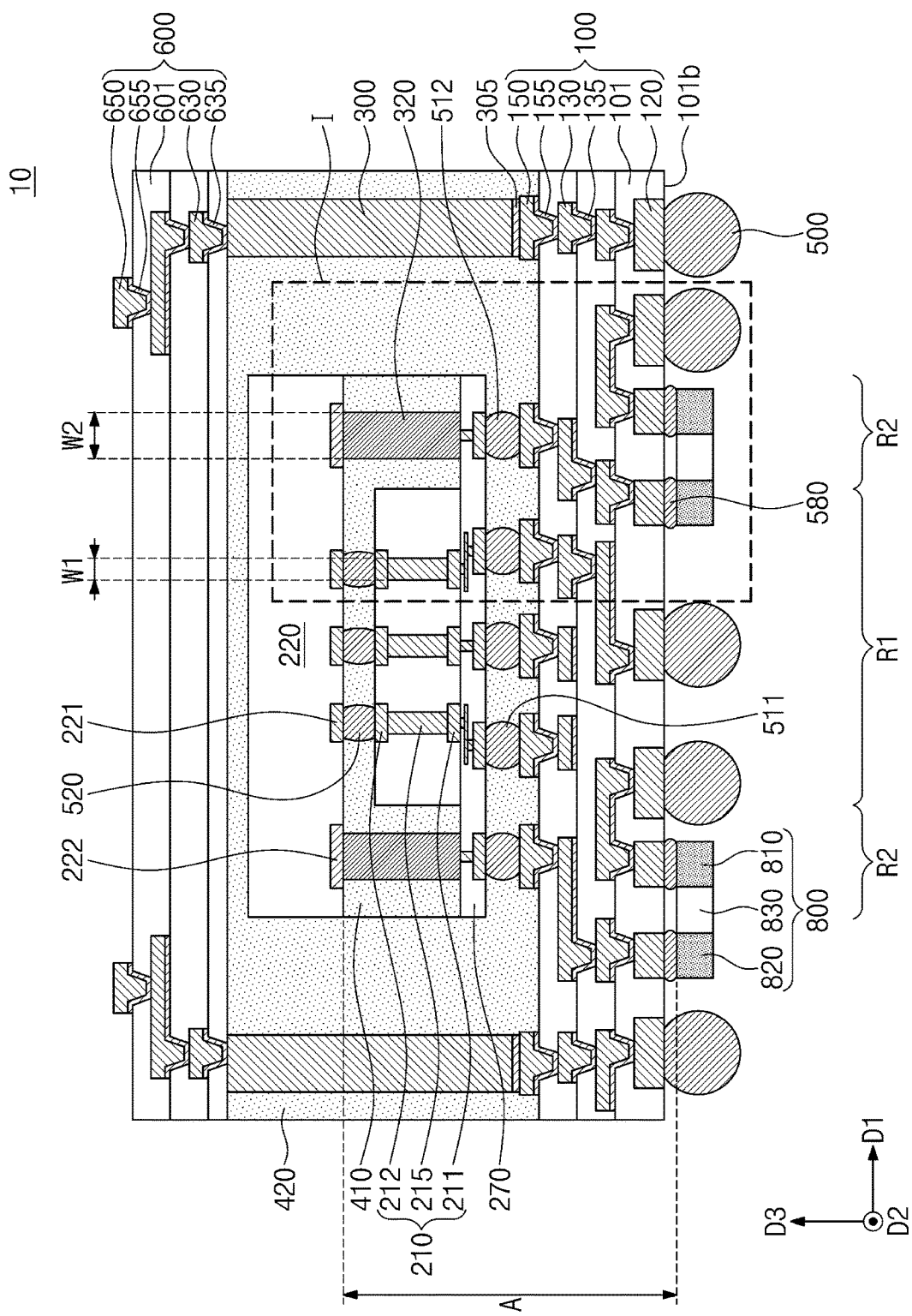
FIG. 1A is a cross-sectional view that illustrates a semiconductor package according to some embodiments of the inventive concepts.

Hereinafter, various embodiments of the inventive concepts will be described with reference to the accompanying drawings. Like reference symbols in the drawings may denote like elements, and to the extent that a description of an element has been omitted, it may be understood that the element is at least similar to corresponding elements that are described elsewhere in the specification.

Figure 1B:
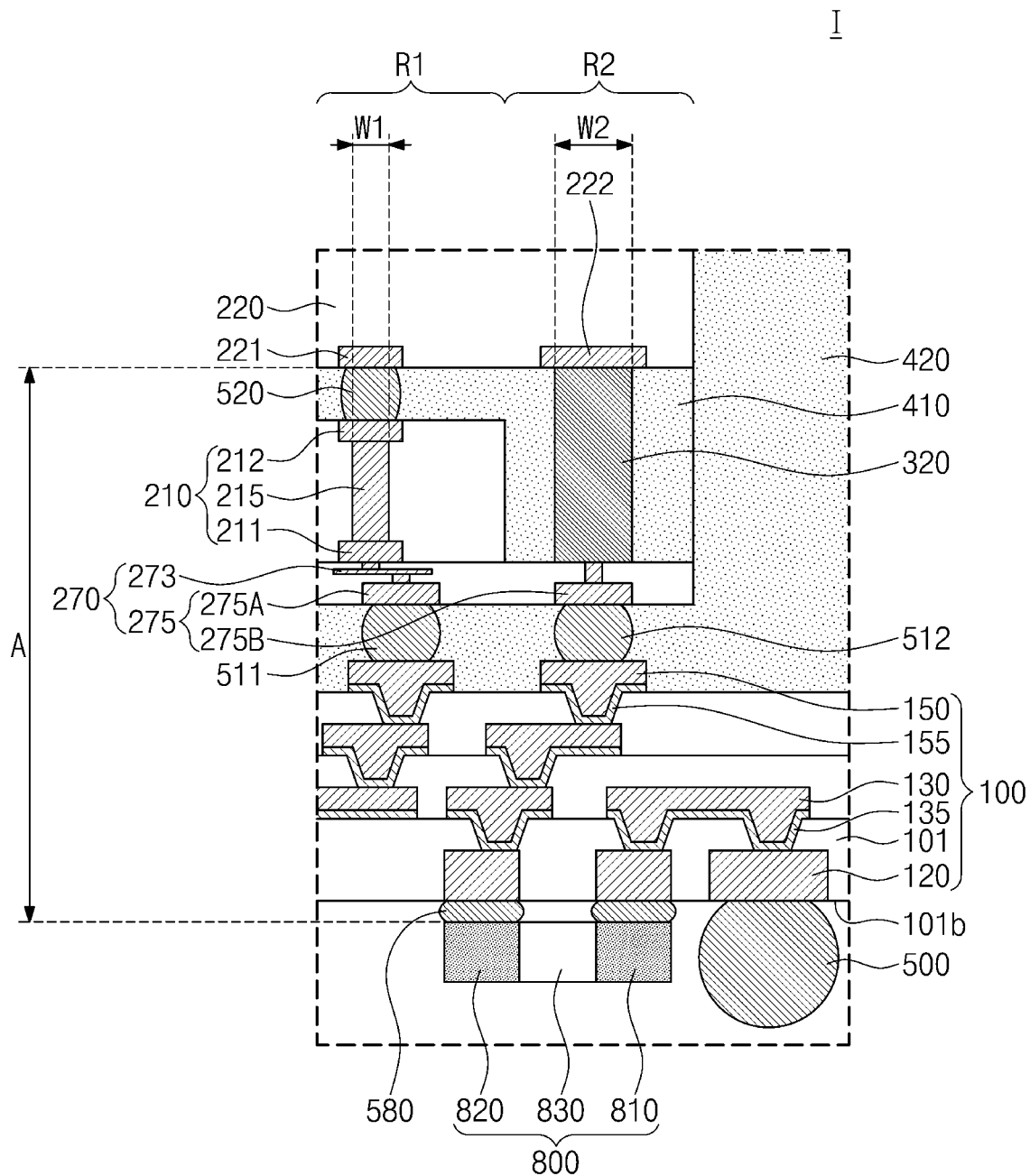
FIG. 1B is an enlarged view of a region 'I' of FIG. 1A.
Figure 1B:
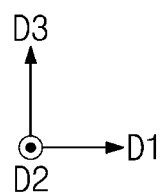

FIG. 1A is a cross-sectional view that illustrates a semiconductor package according to some embodiments of the inventive concepts. FIG. 1B is an enlarged view of a region 'I' of FIG. 1A.

Referring to FIGS. 1A and 1B, a semiconductor package 10 may include a first redistribution substrate 100, solder balls 500, a passive device 800, a first semiconductor chip 210, a second semiconductor chip 220, a conductive post 320, a connection structure 300, a first molding layer 410, a second molding layer 420, and a second redistribution substrate 600. In some embodiments, the semiconductor package 10 may correspond to a lower package.

The first redistribution substrate 100 may include a first insulating layer 101, under bump patterns 120, first redistribution patterns 130, first seed patterns 135, first seed pads 155, and first redistribution pads 150. For example, the first insulating layer 101 may include an organic material such as a photo-imageable dielectric (PID) material. The PID material may be a photosensitive polymer. For example, the PID material may include photosensitive polyimide, polybenzoxazole, a phenol-based polymer, and/or a benzocyclobutene-based polymer. The first insulating layer 101 may be provided as a plurality of first insulating layers 101. The number of the first insulating layers 101 stacked sequentially may be variously changed. The plurality of first insulating layers 101 may include the same material. An interface between the first insulating layers 101 adjacent to each other might not be visible or observed. For example, there might not be a visible boundary between each of the first insulating layers 101.

A first direction D1 may be parallel to a bottom surface 101b of a lowermost first insulating layer 101 of the first insulating layers 101. A second direction D2 may be parallel to the bottom surface 101b of the lowermost first insulating layer 101 and may be substantially perpendicular to the first direction D1. The first direction D1 and the second direction D2 may be horizontal directions. A third direction D3 (e.g., a vertical direction) may be substantially perpendicular to the first direction D1 and the second direction D2.

The under bump patterns 120 may be provided in the lowermost first insulating layer 101. Bottom surfaces of the under bump patterns 120 might not be covered by the lowermost first insulating layer 101. The under bump patterns 120 may function as pads of the solder balls 500. The under bump patterns 120 may be laterally spaced apart from each other and may be electrically insulated from each other. As described herein, when two components are laterally spaced apart from each other, they may be horizontally spaced apart from each other. The term "horizontal" may mean "parallel to a bottom surface of the first redistribution substrate 100 or the first direction D1". The bottom surface of the first redistribution substrate 100 may include the bottom surface 101b of the lowermost first insulating layer 101 and the bottom surfaces of the under bump patterns 120. The under bump patterns 120 may include a metal material (e.g., copper).

The first redistribution patterns 130 may be provided on the under bump patterns 120 and may be electrically connected to the under bump patterns 120. The first redistribution patterns 130 may be laterally spaced apart from each other and may be electrically separated from each other. The first redistribution patterns 130 may include a metal (e.g., copper). It may be understood that when a component is electrically connected to the first redistribution substrate 100, it may be electrically connected to one of the first redistribution patterns 130 and the under bump patterns 120.

Each of the first redistribution patterns 130 may include a first via portion and a first interconnection portion. The first via portion may be provided in a corresponding first insulating layer of the first insulating layers 101. The first interconnection portion may be provided on the first via portion and may be connected to the first via portion without an interface therebetween. A width of the first interconnection portion may be greater than a width of the first via portion. The first interconnection portion may extend onto a top surface of the corresponding first insulating layer 101. In the present specification, the term "via" may refer to a component for vertical connection, and the term "interconnection" may refer to a component that facilitates a connection across a horizontal direction. The term "vertical" may mean "parallel to the third direction D3".

The first redistribution patterns 130 may include lower redistribution patterns and upper redistribution patterns. The lower redistribution patterns may be disposed on the under bump patterns 120. The upper redistribution patterns may be disposed on the lower redistribution patterns and may be connected to the lower redistribution patterns.

The first seed patterns 135 may be disposed on bottom surfaces of the first redistribution patterns 130, respectively. For example, each of the first seed patterns 135 may cover a bottom surface and a side surface of the first via portion and a bottom surface of the first interconnection portion of a corresponding one of the first redistribution patterns 130. For example, the first seed patterns 135 may wrap an understand of each of the first redistribution patterns 130. Each of the first seed patterns 135 might not extend onto a side surface of the first interconnection portion of the corresponding first redistribution pattern 130. The first seed patterns 135 may include a different material from that of the under bump patterns 120 and the first redistribution patterns 130. For example, the first seed patterns 135 may include a conductive seed material. The conductive seed material may include copper, titanium, and/or an alloy thereof. The first seed patterns 135 may function as barrier layers to prevent diffusion of a material included in the first redistribution patterns 130.

The first redistribution pads 150 may be laterally spaced apart from each other. The first redistribution pads 150 may be disposed on the upper redistribution patterns of the first redistribution patterns 130 and may be connected to the first redistribution patterns 130. Each of the first redistribution pads 150 may be connected to a corresponding under bump pattern 120 through the first redistribution patterns 130. Since the first redistribution patterns 130 are provided to facilitate connections across the horizontal direction(s), at least one of the first redistribution pads 150 might not be vertically aligned with the under bump pattern 120 electrically connected thereto. Accordingly, the arrangement of the first redistribution pads 150 may be more freely designed. The number of the first redistribution patterns 130 stacked between the under bump patterns 120 and the first redistribution pads 150 is not necessarily limited to FIG. 1A and may be variously changed.

The first redistribution pads 150 may be provided in and on an uppermost first insulating layer 101. A lower portion of each of the first redistribution pads 150 may be disposed in the uppermost first insulating layer 101. For example, a lower portion of each of the first redistribution pads 150 may penetrate the uppermost first insulating layer 101. An upper portion of each of the first redistribution pads 150 may extend onto a top surface of the uppermost first insulating layer 101. The first redistribution pads 150 may include a metal (e.g., copper). The first redistribution pads 150 may further include nickel, gold, and/or an alloy thereof.

The first seed pads 155 may be provided on bottom surfaces of the first redistribution pads 150, respectively. The first seed pads 155 may be provided between each of the upper redistribution patterns of the first redistribution patterns 130 and each of the first redistribution pads 150, and may extend between the uppermost first insulating layer 101 and the first redistribution pads 150. The first seed pads 155 may include a different material from that of the first redistribution pads 150. The first seed pads 155 may include, for example, a conductive seed material.

The first redistribution substrate 100 may include an edge region and a center region. The edge region of the first redistribution substrate 100 may be provided between the center region and a side surface of the first redistribution substrate 100 when viewed in a plan view. The edge region of the first redistribution substrate 100 may surround the center region when viewed in a plan view.

The solder balls 500 may be disposed on the bottom surface of the first redistribution substrate 100. For example, the solder balls 500 may be disposed on the bottom surfaces of the under bump patterns 120, and may be connected to the under bump patterns 120, respectively. The solder balls 500 may be electrically connected to the first redistribution patterns 130 through the under bump patterns 120. The solder balls 500 may be laterally spaced apart from each other and may be electrically isolated from each other. The solder balls 500 may include a solder material. For example, the solder material may include tin, bismuth, lead, silver, or an alloy thereof. The solder balls 500 may include a signal solder ball, a ground solder ball, and/or a power solder ball.

The passive device 800 may be mounted on the bottom surface of the first redistribution substrate 100. The passive device 800 may be laterally spaced apart from the solder balls 500. A bottom surface of the passive device 800 may be located at a higher level than bottom surfaces of the solder balls 500. For example, the bottom surface of the passive device 800 may be located at a higher level than the bottommost surfaces of the solder balls 500. Thus, when the solder balls 500 of the semiconductor package 10 are coupled to a board, the passive device 800 may be spaced apart from the board. Accordingly, the semiconductor package 10 may be mounted on the board without interfering with the passive device 800. As described herein, a level of a component may refer to a vertical level. A level difference between two components may be measured in the third direction D3.

For example, the passive device 800 may be a capacitor. Alternatively, the passive device 800 may be an inductor or a resistor. The passive device 800 may include a first conductive terminal 810, a second conductive terminal 820, and an insulator 830. The first conductive terminal 810 and the second conductive terminal 820 may be a first electrode and a second electrode, respectively. The second conductive terminal 820 may be spaced apart from the first conductive terminal 810. The insulator 830 may be provided between the first conductive terminal 810 and the second conductive terminal 820.

However, the structure and the components of the passive device 800 are not necessarily limited to FIG. 1A but may be variously changed. For example, the passive device 800 may include an integrated stack capacitor (ISC). In this case, a stack structure may be disposed in the insulator 830. The stack structure may include a plurality of conductive layers, and dielectric layers disposed between the conductive layers.

Solder connecting portions 580 may be provided between the first conductive terminal 810 and a corresponding under bump pattern 120 and between the second conductive terminal 820 and a corresponding under bump pattern 120. The solder connecting portions 580 may be spaced apart from each other and may be electrically isolated from each other. The first conductive terminal 810 may be electrically connected to the corresponding under bump pattern 120 through one of the solder connecting portions 580. For example, the first conductive terminal 810 may be electrically connected to one solder ball 500 of the solder balls 500 through the first redistribution substrate 100. The one solder ball 500 may be a ground or a power solder ball. Accordingly, a voltage may be applied to the first conductive terminal 810. The voltage may be a ground voltage or a power voltage.

The second conductive terminal 820 may be electrically connected to the first redistribution substrate 100 through another of the solder connecting portions 580. For example, the second conductive terminal 820 may be electrically connected to a corresponding first redistribution pad 150 through the first redistribution patterns 130. Thus, an external voltage may be applied to the passive device 800 through the solder ball 500, and a voltage output from the passive device 800 may be transmitted to the first redistribution pad 150 electrically connected thereto.

The first semiconductor chip 210 may be mounted on a top surface of the first redistribution substrate 100. For example, the first semiconductor chip 210 may be disposed on the center region of the first redistribution substrate 100 when viewed in a plan view. For example, the first semiconductor chip 210 may be a logic chip or a buffer chip. The logic chip may include an ASIC chip and/or an application processor (AP) chip. The ASIC chip may include an application specific integrated circuit (ASIC). For other examples, the logic chip may include a central processing unit (CPU) or a graphic processing unit (GPU). In some embodiments, the first semiconductor chip 210 may be a memory chip.

The first semiconductor chip 210 may include lower pads 211, through vias 215, and upper pads 212. The lower pads 211 and the upper pads 212 may be provided on a bottom surface and a top surface of the first semiconductor chip 210, respectively. The lower pads 211 and the upper pads 212 may be electrically connected to integrated circuits of the first semiconductor chip 210. The lower pads 211 or the upper pads 212 may be chip pads. It may be understood that when a component is electrically connected to a semiconductor chip, it may be electrically connected to integrated circuits of the semiconductor chip through chip pads of the semiconductor chip. It may be understood that when two components are electrically connected to each other, they may be connected directly to each other, or they may be connected indirectly to each other through another component.

The through vias 215 may be provided in the first semiconductor chip 210 and may be connected to the lower pads 211 and the upper pads 212. The through vias 215 may be electrically connected to the integrated circuits of the first semiconductor chip 210. The through vias 215 may include signal through vias, ground through vias, and power through vias. Each of the through vias 215 may have a first width W1. The first width W1 and a pitch of the through vias 215 may be relatively small. For example, the first width W1 may range from about 5 μm to about 29 μm. Since the first width W1 is equal to or greater than 5 μm, the through vias 215 may be easily formed, e.g., reliably formed without defects. Since the first width W1 is equal to or less than 29 μm, the through vias 215 may be formed at a fine pitch.

The second semiconductor chip 220 may be disposed on the first semiconductor chip 210. The second semiconductor chip 220 may be of a different kind than the first semiconductor chip 210. For example, the second semiconductor chip 220 may be a logic chip or a buffer chip. Alternatively, the second semiconductor chip 220 may be a memory chip.

The second semiconductor chip 220 may have a first region R1 and a second region R2 when viewed in a plan view. The first region R1 of the second semiconductor chip 220 may be provided on the first semiconductor chip 210 and may vertically overlap with the first semiconductor chip 210. The second region R2 of the second semiconductor chip 220 may correspond to an edge region of the second semiconductor chip 220 when viewed in a plan view. The second region R2 of the second semiconductor chip 220 might not overlap with the first semiconductor chip 210 when viewed in a plan view. The second region R2 of the second semiconductor chip 220 may vertically overlap with at least a portion of the passive device 800.

First conductive pads 221 and a second conductive pad 222 may be provided on a bottom surface of the second semiconductor chip 220. The first conductive pads 221 may be provided on a bottom surface of the second semiconductor chip 220 within the first region R1, and the second conductive pad 222 may be provided on a bottom surface of the second semiconductor chip 220 within the second region R2. A width of the second conductive pad 222 may be greater than widths of the first conductive pads 221. The first conductive pads 221 and the second conductive pad 222 may be, but are not necessarily limited to, chip pads of the second semiconductor chip 220.

The semiconductor package 10 may further include solder bumps 520. The solder bumps 520 may be disposed between the first semiconductor chip 210 and the second semiconductor chip 220 and may be connected to the upper pads 212 and the first conductive pads 221. Thus, the second semiconductor chip 220 may be electrically connected to the first semiconductor chip 210 through the solder bumps 520. The solder bumps 520 may further include pillar patterns, and the pillar pattern may include a metal (e.g., copper).

The conductive post 320 may be provided on the first redistribution substrate 100 and may be laterally spaced apart from the first semiconductor chip 210. The conductive post 320 may be disposed between the top surface of the first redistribution substrate 100 and the bottom surface of the second semiconductor chip 220 in the second region R2, and may be electrically connected to the first redistribution substrate 100 and the second semiconductor chip 220. For example, the conductive post 320 may be connected directly to the second conductive pad 222. Alternatively, unlike the embodiment illustrated in FIGS. 1A and 1B, a seed pattern may be formed between the conductive post 320 and the second conductive pad 222, and the conductive post 320 may be connected to the second conductive pad 222 through the seed pattern. The seed pattern may include a conductive seed material.

The conductive post 320 may vertically overlap with the passive device 800. For example, the conductive post 320 may completely overlap with the passive device 800 or may partially overlap with the passive device 800. The conductive post 320 may be electrically connected to the passive device 800 through the first redistribution substrate 100. The conductive post 320 may be a voltage supply post and may function as a voltage supply path. A voltage supplied through the conductive post 320 may be a power voltage or a ground voltage. For example, the voltage output from the passive device 800 may be transmitted to the second semiconductor chip 220 through the conductive post 320. Since the conductive post 320 vertically overlaps with the second semiconductor chip 220 and the passive device 800, a length of a voltage supply path between the second semiconductor chip 220 and the passive device 800 may be reduced.

A distance A between a top surface of the conductive post 320 and a top surface of the passive device 800 may range from about 50 μm to about 1000 μm. If the distance A between the top surface of the conductive post 320 and the top surface of the passive device 800 is less than 50 μm, thermal stability of the first semiconductor chip 210 may be reduced. According to the embodiments, since the distance A between the top surface of the conductive post 320 and the top surface of the passive device 800 is about 50 μm or more, thermal reliability of the first semiconductor chip 210 may be increased. Since the distance A between the top surface of the conductive post 320 and the top surface of the passive device 800 is about 1000 μm or less, a voltage may be reliably supplied between the passive device 800 and the second semiconductor chip 220.

A diameter of the conductive post 320 may be greater than diameters of the through vias 215. For example, a second width W2 of the conductive post 320 may be greater than the first widths W1 of the through vias 215. Accordingly, a resistance of the conductive post 320 may be reduced. The conductive post 320 may more reliably supply a voltage to the second semiconductor chip 220. As a result, reliability of the semiconductor package 10 may be increased.

The second width W2 of the conductive post 320 may range from about 30 μm to about 200 μm. If the second width W2 is less than 30 μm, the resistance of the conductive post 320 may be increased. If the second width W2 is greater than 200 μm, the arrangement of the first semiconductor chip 210 and the connection structures 300 may be limited by the conductive post 320. According to the embodiments, the second width W2 may range from about 30 μm to about 200 μm. Accordingly, the conductive post 320 may have a small resistance. A voltage may be reliably supplied to the second semiconductor chip 220 through the conductive post 320. In addition, limitations on the arrangement of the first semiconductor chip 210 and the connection structures 300 may be reduced. A bottom surface of the conductive post 320 may be located at substantially the same level as the bottom surface of the first semiconductor chip 210.

According to the embodiments, since the conductive post 320 is provided, electrical paths of the second semiconductor chip 220 may be distributed. For example, the second semiconductor chip 220 may be electrically connected to the solder balls 500 through a connection with the conductive post 320 as well as a connection with the through vias 215.

A voltage applied to the one solder ball 500 may be transmitted to the second semiconductor chip 220 through the passive device 800. Since the passive device 800 supplies a voltage to the second semiconductor chip 220, the semiconductor package 10 may provide increased reliability and power integrity.

The conductive post 320 may be provided as a plurality of conductive posts 320. The plurality of conductive posts 320 may be disposed at both sides of the first semiconductor chip 210. The passive device 800 may be provided as a plurality of passive devices 800. The plurality of passive devices 800 may overlap with and be electrically connected to the conductive posts 320, respectively. Hereinafter, one of the passive devices 800 and one of the conductive posts 320 will be mainly described for the purpose of ease and convenience in explanation.

The first molding layer 410 may be provided on the bottom surface of the second semiconductor chip 220. The first molding layer 410 may cover a side surface of the first semiconductor chip 210 and a side surface of the conductive post 320. The first molding layer 410 may extend into a gap region between the first semiconductor chip 210 and the second semiconductor chip 220 to seal and/or at least partially encapsulate the solder bumps 520. Side surfaces of the first molding layer 410 may be aligned (e.g., vertically aligned) with side surfaces of the second semiconductor chip 220. A bottom surface of the first molding layer 410 may be substantially coplanar with the bottom surface of the first semiconductor chip 210 and the bottom surface of the conductive post 320. The first molding layer 410 may include an insulating polymer such as an epoxy molding compound.

The semiconductor package 10 may further include a lower redistribution layer 270. The lower redistribution layer 270 may be disposed on the bottom surface of the first semiconductor chip 210, the bottom surface of the first molding layer 410, and the bottom surface of the conductive post 320. The lower redistribution layer 270 may include a lower insulating layer, lower redistribution patterns 273, and lower redistribution pads 275, as illustrated in FIG. 1B. For example, the lower insulating layer may include an organic material such as a photo-imageable dielectric (PID) material. The lower insulating layer may be, but is not necessarily limited to, a multi-layer. The lower redistribution patterns 273 may be provided in the lower insulating layer. At least one of the lower redistribution patterns 273 may be connected to the conductive post 320. Other lower redistribution patterns 273 of the lower redistribution patterns 273 may be connected to the lower pads 211. It may be understood that when a component is electrically connected to the lower redistribution layer 270, it may be electrically connected to the lower redistribution patterns 273.

The lower redistribution pads 275 may be provided on a bottom surface of the lower redistribution layer 270 and may be electrically connected to the lower redistribution patterns 273. The lower redistribution pads 275 may include first lower redistribution pads 275A and a second lower redistribution pad 275B. The first lower redistribution pads 275A may be connected to the lower pads 211 through the lower redistribution patterns 273. At least one of the first lower redistribution pads 275A might not be vertically aligned with the lower pad 211 electrically connected thereto. Accordingly, the arrangement of the first lower redistribution pads 275A may not be limited by the through vias 215 and the lower pads 211, but may be freely designed.

The second lower redistribution pad 275B may be connected to the conductive post 320 through a corresponding lower redistribution pattern 273. The second lower redistribution pad 275B may be laterally spaced apart from and electrically insulated from the first lower redistribution pads 275A. The second lower redistribution pad 275B may be a voltage supply pad. At least a portion of the second lower redistribution pad 275B may vertically overlap with the conductive post 320. Accordingly, a length of an electrical path between the passive device 800 and the conductive post 320 may be reduced. The lower redistribution patterns 273 and the lower redistribution pads 275 may include a metal (e.g., copper).

The semiconductor package 10 may further include first bumps 511 and a second bump 512. The first bumps 511 may be disposed between the first redistribution substrate 100 and the first semiconductor chip 210. For example, each of the first bumps 511 may be provided between the first redistribution substrate 100 and the lower redistribution layer 270 and may be connected to a corresponding first redistribution pad 150 and a corresponding lower redistribution pad 275. Accordingly, the first bumps 511 may be electrically connected to the through vias 215. The first bumps 511 may include a solder material. The first bumps 511 may further include pillar patterns.

The second bump 512 may be disposed between the first redistribution substrate 100 and the conductive post 320. For example, the second bump 512 may be provided between the first redistribution substrate 100 and the lower redistribution layer 270 and may be connected to a corresponding first redistribution pad 150 and the second lower redistribution pad 275B. Accordingly, the second bump 512 may be electrically connected to the conductive post 320. The second bump 512 may be a power bump or a ground bump, and may provide a path for supplying a voltage to the second semiconductor chip 220. A height of the second bump 512 may be substantially equal to heights of the first bumps 511. A width of the second bump 512 may be substantially equal to widths of the first bumps 511. It may be understood that when widths, heights or levels of components are described as substantially equal to or the same as each other, a difference therebetween may be within in a tolerance occurring in a manufacturing process. The second bump 512 may include a solder material. The second bump 512 may further include a pillar pattern.

As illustrated in FIG. 1A, the connection structure 300 may be disposed on the first redistribution substrate 100. The connection structure 300 may be disposed on a top surface of the edge region of the first redistribution substrate 100. The connection structure 300 may be provided as a plurality of connection structures 300, and the plurality of connection structures 300 may be spaced apart from each other. The connection structures 300 may be laterally spaced apart from the first semiconductor chip 210, the conductive post 320, the second semiconductor chip 220, and the first molding layer 410. Top surfaces of the connection structures 300 may be located at a higher level than a top surface of the conductive post 320. The top surfaces of the connection structures 300 may be located at the same level as or at a higher level than a top surface of the second semiconductor chip 220. The connection structures 300 may be disposed on corresponding first redistribution pads 150, and may be connected to the corresponding first redistribution pads 150. Accordingly, the connection structures 300 may be connected to the first redistribution substrate 100. The connection structures 300 may be electrically connected to the solder balls 500, the first semiconductor chip 210, and/or the second semiconductor chip 220 through the first redistribution substrate 100. Each of the connection structures 300 may have a circular pillar shape. However, the shapes of the connection structures 300 may be variously modified. The connection structures 300 may be metal posts. For example, the connection structures 300 may include copper or tungsten.

The semiconductor package 10 may further include conductive seed patterns 305. The conductive seed patterns 305 may be disposed on bottom surfaces of the connection structures 300. For example, the conductive seed patterns 305 may be disposed between the connection structures 300 and the corresponding first redistribution pads 150. The conductive seed patterns 305 may include a different material from that of the first redistribution pads 150 and the connection structures 300. For example, the conductive seed patterns 305 may include a conductive seed material. In some embodiments, the conductive seed patterns 305 may be omitted, and the connection structures 300 may be connected directly to the first redistribution pads 150.

The second molding layer 420 may be disposed on the first redistribution substrate 100, and may cover side surfaces of the connection structures 300, the side surface of the first molding layer 410, and the side surface and the top surface of the second semiconductor chip 220. A top surface of the second molding layer 420 may be coplanar with the top surfaces of the connection structures 300. In some embodiments, the second molding layer 420 may expose the top surface of the second semiconductor chip 220. The second molding layer 420 may extend onto the bottom surface of the lower redistribution layer 270 to seal and/or at least partially encapsulate the first bumps 511 and the second bump 512. A side surface of the second molding layer 420 may be vertically aligned with the side surface of the first redistribution substrate 100. The second molding layer 420 may include an insulating polymer such as an epoxy molding compound. The second molding layer 420 may include the same material as or a different material from that of the first molding layer 410.

The second redistribution substrate 600 may be disposed on the second molding layer 420 and the connection structures 300. The second redistribution substrate 600 may be disposed on the second semiconductor chip 220 and may be vertically spaced apart from the top surface of the second semiconductor chip 220. The second redistribution substrate 600 may be electrically connected to the connection structures 300.

The second redistribution substrate 600 may include a second insulating layer 601, second redistribution patterns 630, second seed patterns 635, and second redistribution pads 650. The second insulating layer 601 may include a plurality of second insulating layers 601. The plurality of second insulating layers 601 may be stacked on the second molding layer 420. Each of the second insulating layers 601 may include a photo-imageable dielectric (PID) material. For example, the second insulating layers 601 may include the same material. An interface between the second insulating layers 601 adjacent to each other might not be visible or observed. For example, a boundary between each layer of the second insulating layers 601 might not be visible. The number of the second insulating layers 601 may be variously changed according to embodiments.

The second redistribution patterns 630 may be provided on the connection structures 300. Each of the second redistribution patterns 630 may include a second via portion and a second interconnection portion. The second via portion may be provided in a corresponding layer of the second insulating layers 601. For example, the second via portion may penetrate a corresponding layer of the second insulating layers 601. The second interconnection portion may be provided on the second via portion and may be connected to the second via portion without an interface therebetween. The second interconnection portion of each of the second redistribution patterns 630 may extend onto a top surface of a corresponding one of the second insulating layers 601. The second redistribution patterns 630 may include a metal (e.g., copper).

The second redistribution patterns 630 may include second lower redistribution patterns and second upper redistribution patterns. For example, the second lower redistribution patterns may be provided on the top surfaces of the connection structures 300 and may be connected to the connection structures 300. The second upper redistribution patterns may be disposed on the second lower redistribution patterns and may be connected to the second lower redistribution patterns.

The second seed patterns 635 may be disposed on bottom surfaces of the second redistribution patterns 630. For example, each of the second seed patterns 635 may be provided on a bottom surface and a side surface of the second via portion of a corresponding second redistribution pattern 630 and may extend onto a bottom surface of the second interconnection portion of the corresponding second redistribution pattern 630. The second seed patterns 635 may include a different material from that of the connection structures 300 and the second redistribution patterns 630. For example, the second seed patterns 635 may include a conductive seed material. The second seed patterns 635 may function as barrier layers to prevent diffusion of a material included in the second redistribution patterns 630.

The second redistribution pads 650 may be disposed on the second upper redistribution patterns of the second redistribution patterns 630 and may be connected to the second redistribution patterns 630. The second redistribution pads 650 may be laterally spaced apart from each other. Lower portions of the second redistribution pads 650 may be provided in an uppermost second insulating layer 601. Upper portions of the second redistribution pads 650 may extend onto a top surface of the uppermost second insulating layer 601. For example, the second redistribution pads 650 may include a metal (e.g., copper).

The second redistribution pads 650 may be connected to the connection structures 300 through the second redistribution patterns 630. Since the second redistribution patterns 630 are provided, at least one of the second redistribution pads 650 might not be vertically aligned with the connection structure 300 electrically connected thereto. Accordingly, the arrangement of the second redistribution pads 650 may be freely designed; for example, the arrangement of the second redistribution pads 650 may not be significantly limited by the placement of the connection structure 300. The number of the second redistribution patterns 630 stacked between one of the connection structures 300 and a corresponding second redistribution pad 650 is not necessarily limited to the embodiment shown in FIG. 1A but may be variously changed. For example, one second redistribution pattern 630 or three or more second redistribution patterns 630 may be provided between the one connection structure 300 and the corresponding second redistribution pad 650.

The second redistribution substrate 600 may further include second seed pads 655. The second seed pads 655 may be disposed between uppermost second redistribution patterns 630 and the second redistribution pads 650. The second seed pads 655 may include a conductive seed material.

Figure 1C:
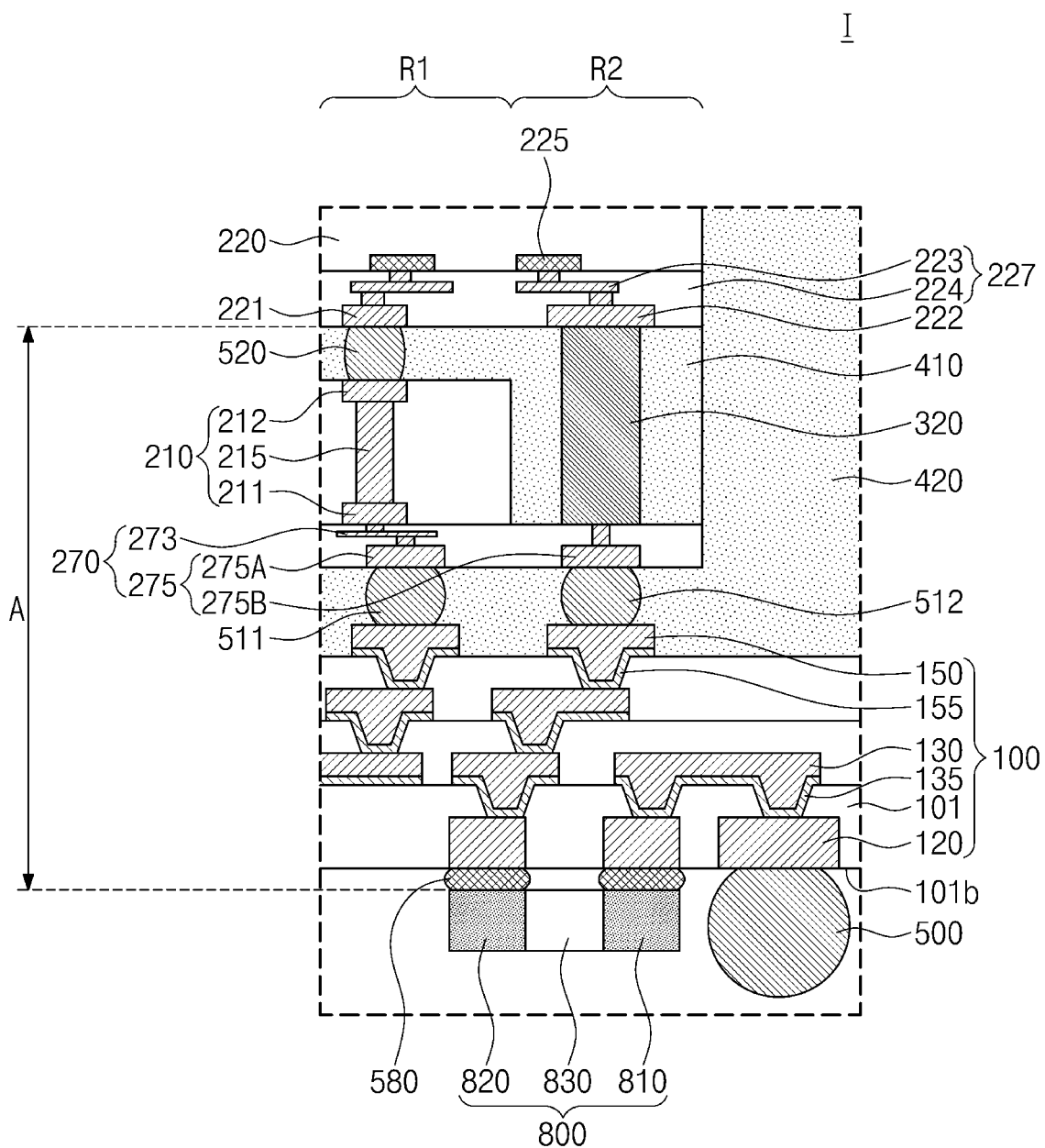
FIG. 1C is a view that illustrates an upper redistribution layer and a second semiconductor chip according to some embodiments of the inventive concepts.
Figure 1C:
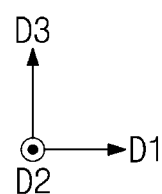

FIG. 1C is an enlarged view corresponding to the region 'I' of FIG. 1A to illustrate an upper redistribution layer and a second semiconductor chip according to some embodiments of the inventive concepts. In descriptions of FIG. 1C, one of upper pads, one of solder bumps and one of first conductive pads will be mainly described for the purpose of ease and convenience in explanation.

Referring to FIG. 1C, a second semiconductor chip 220 may include chip pads 225 disposed on its bottom surface. The chip pads 225 may include a metal (e.g., aluminum).

In some embodiments, an upper redistribution layer 227 may be provided on the bottom surface of the second semiconductor chip 220. The upper redistribution layer 227 may include an upper insulating layer 224 and upper redistribution patterns 223. For example, the upper insulating layer 224 may include an organic material such as a photo-imageable dielectric (PID) material. The upper insulating layer 224 may be, but is not necessarily limited to, a multi-layer. The upper redistribution patterns 223 may be provided in the upper insulating layer 224. The upper redistribution patterns 223 may be connected to the chip pads 225 of the second semiconductor chip 220. With reference to this embodiment, it may be understood that when a component is electrically connected to the upper redistribution layer 227, it may be electrically connected to at least one of the upper redistribution patterns 223.

A first conductive pad 221 may be provided on a bottom surface of the upper redistribution layer 227 and may be connected to a corresponding upper redistribution pattern 223. Accordingly, the first conductive pad 221 may be connected to one of the chip pads 225 of the second semiconductor chip 220. A solder bump 520 may be provided between the first semiconductor chip 210 and the upper redistribution layer 227 and may be connected to the upper pad 212 and the first conductive pad 221.

A second conductive pad 222 may be provided on the bottom surface of the upper redistribution layer 227 and may be laterally spaced apart from the first conductive pad 221. The second conductive pad 222 may be connected to another chip pad of the chip pads 225 of the second semiconductor chip 220 through a corresponding upper redistribution pattern 223. The conductive post 320 may be disposed on a bottom surface of the second conductive pad 222 and may be connected to the second conductive pad 222.

The first molding layer 410 may be provided on the bottom surface of the upper redistribution layer 227. The side surface of the first molding layer 410 may be aligned with a side surface of the upper redistribution layer 227 and a side surface of the second semiconductor chip 220.

Figure 1D:
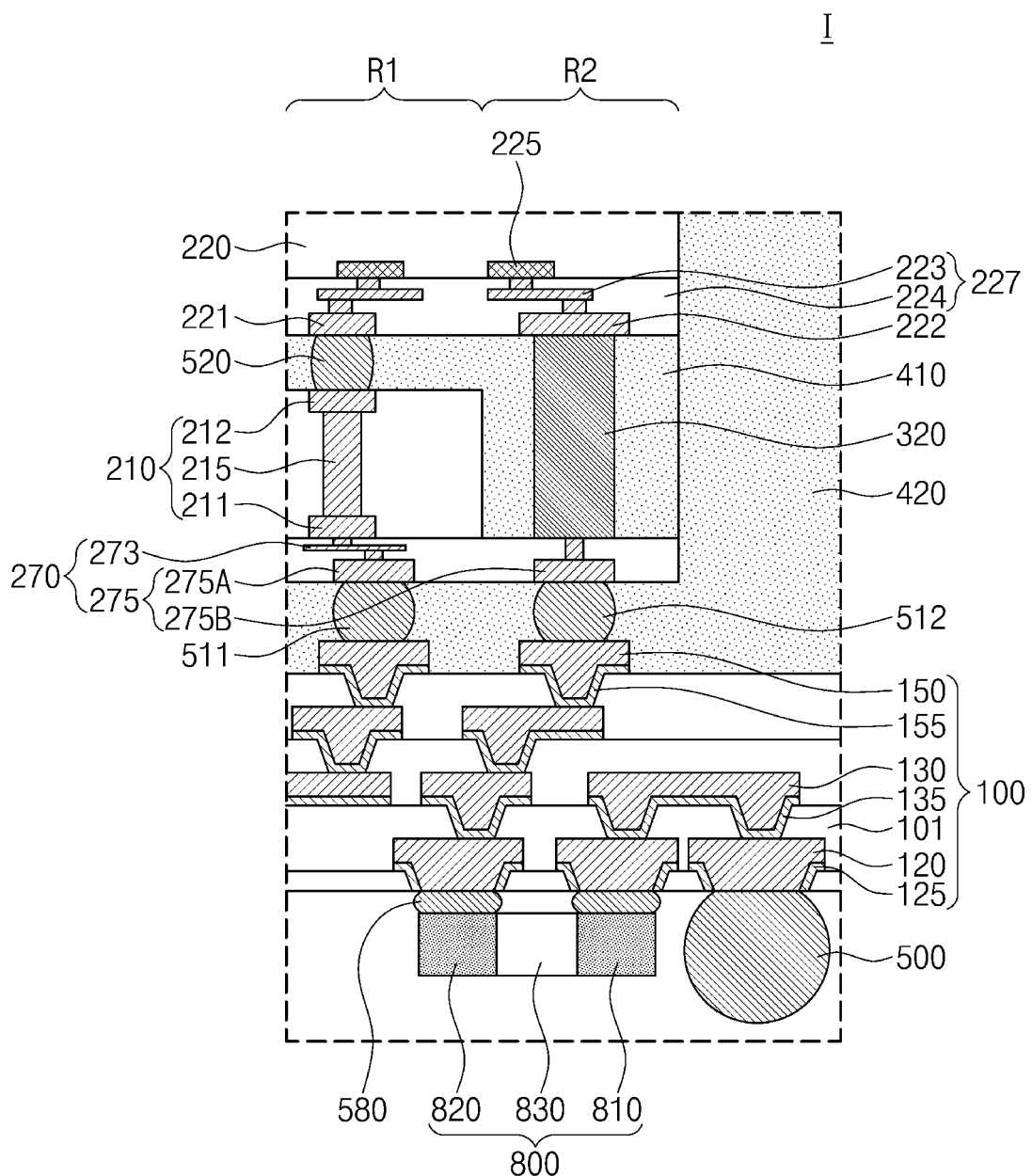
FIG. 1D is a view that illustrates a first redistribution substrate according to some embodiments of the inventive concepts.

FIG. 1D is an enlarged view corresponding to the region 'I' of FIG. 1A to illustrate a first redistribution substrate according to some embodiments of the inventive concepts.

Referring to FIG. 1D, a first redistribution substrate 100 may include the first insulating layers 101, the under bump patterns 120, the first redistribution patterns 130, the first seed patterns 135, the first seed pads 155, and the first redistribution pads 150 and may further include under bump seed patterns 125.

Each of the under bump patterns 120 may have a T-shaped section. For example, a lower portion of each of the under bump patterns 120 may be provided in a lowermost first insulating layer 101. For example, the lower portion of each of the under bump patterns 120 may penetrate the lowermost first insulating layer 101. An upper portion of each of the under bump patterns 120 may have a width greater than that of the lower portion thereof. The upper portion of each of the under bump patterns 120 may extend onto a top surface of the lowermost first insulating layer 101.

The under bump seed patterns 125 may be disposed between the under bump patterns 120 and the lowermost first insulating layer 101. The under bump seed patterns 125 might not cover bottom surfaces of the under bump patterns 120. The solder balls 500 and the solder connecting portions 580 may contact with the bottom surfaces of corresponding under bump patterns 120. The shapes of the under bump patterns 120 and the under bump seed patterns 125 may be variously modified according to embodiments.

Figure 2A:
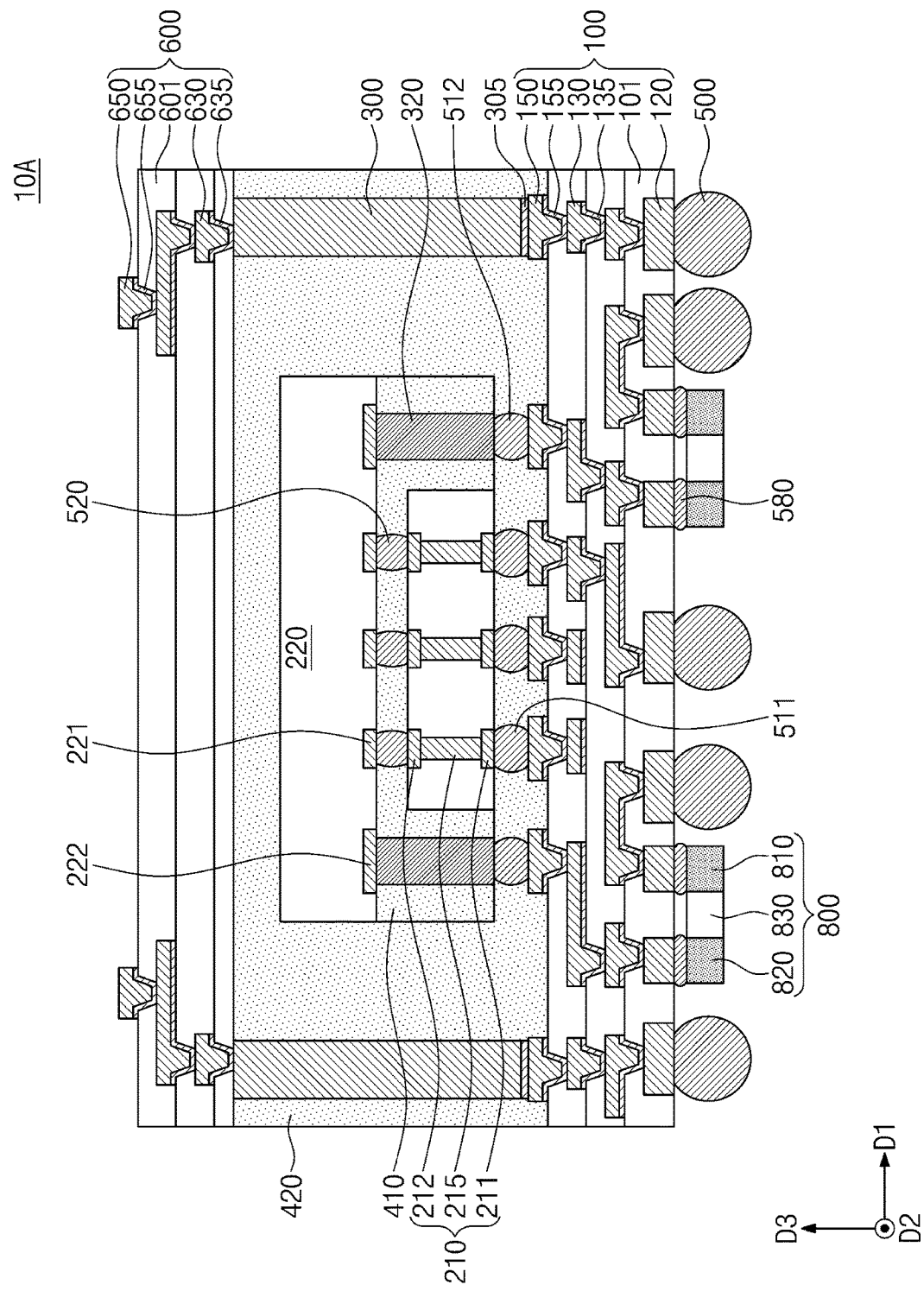
FIG. 2A is a cross-sectional view that illustrates a semiconductor package according to some embodiments of the inventive concepts.

FIG. 2A is a cross-sectional view that illustrates a semiconductor package according to some embodiments of the inventive concepts.

Referring to FIG. 2A, a semiconductor package 10A may include the first redistribution substrate 100, the solder balls 500, the passive device 800, the first semiconductor chip 210, the second semiconductor chip 220, the conductive post 320, the connection structure 300, the first bumps 511, the second bump 512, the first molding layer 410, the second molding layer 420, and the second redistribution substrate 600. However, the semiconductor package 10A might not include the lower redistribution layer 270 described with reference to FIGS. 1A and 1B.

The first bumps 511 may be disposed between the first redistribution substrate 100 and the first semiconductor chip 210. The first bumps 511 may be in contact with corresponding first redistribution pads 150 and the lower pads 211.

The second bump 512 may be disposed between the first redistribution substrate 100 and the conductive post 320. The second bump 512 may be in direct contact with a corresponding first redistribution pad 150 and the conductive post 320.

The second molding layer 420 may extend onto a bottom surface of the first molding layer 410 and onto the bottom surface of the first semiconductor chip 210 to cover the bottom surface of the first molding layer 410 and the bottom surface of the first semiconductor chip 210. The second molding layer 420 may seal and/or at least partially encapsulate the first bumps 511 and the second bump 512.

Figure 2B:
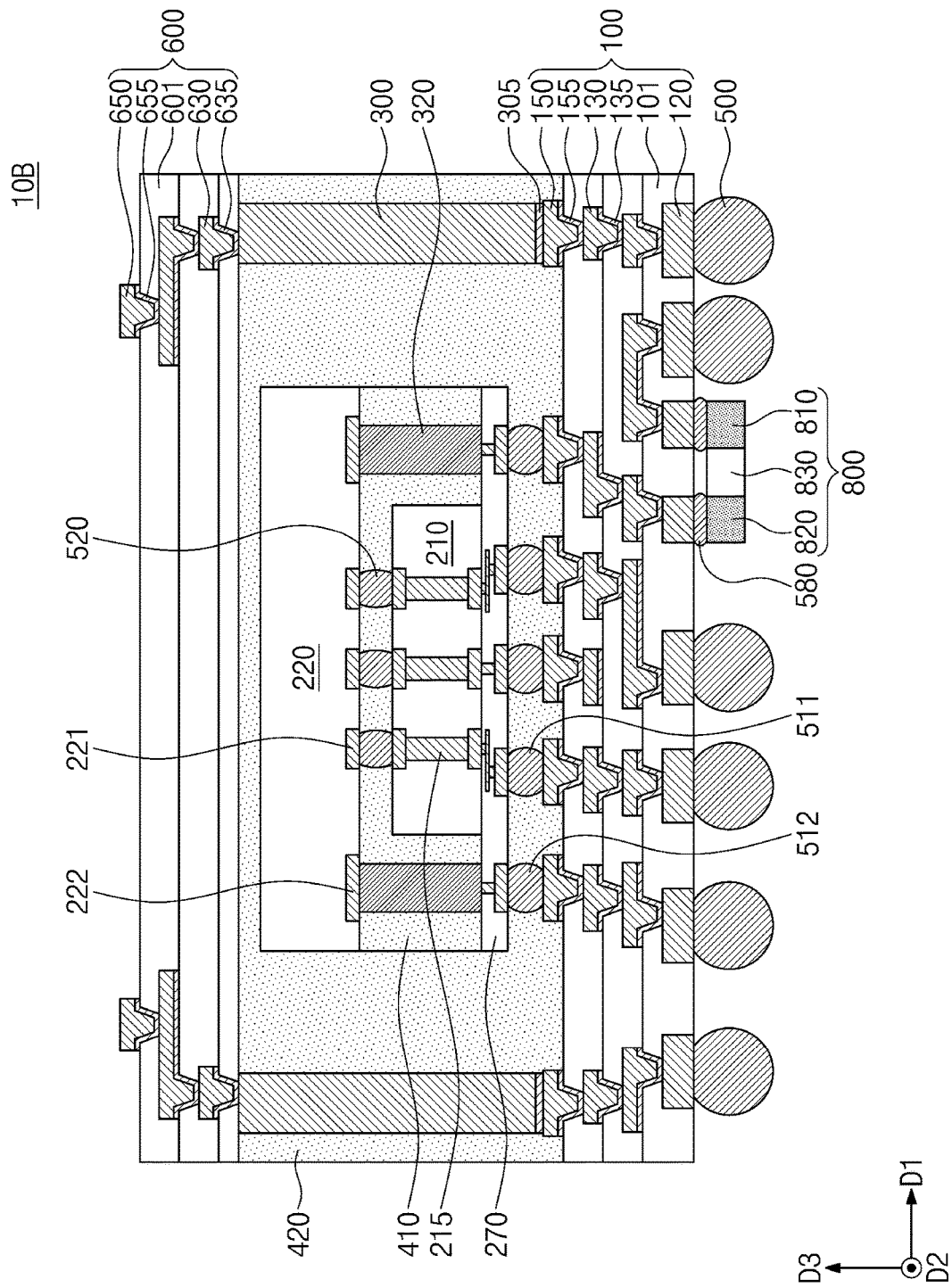
FIG. 2B is a cross-sectional view that illustrates a semiconductor package according to some embodiments of the inventive concepts.

FIG. 2B is a cross-sectional view that illustrates a semiconductor package according to some embodiments of the inventive concepts.

Referring to FIG. 2B, a semiconductor package 10B may include the first redistribution substrate 100, the solder balls 500, the passive device 800, the first and second semiconductor chips 210 and 220, the first and second molding layers 410 and 420, the conductive post 320, the connection structures 300, and the second redistribution substrate 600.

The conductive post 320 may be provided as a plurality of conductive posts 320. The plurality of conductive posts 320 may be disposed at both sides of the first semiconductor chip 210. One of the conductive posts 320 may vertically overlap with the passive device 800 and may be electrically connected to the passive device 800. Another of the conductive posts 320 may be electrically connected to one of the solder balls 500 without passing through to the passive device 800. For example, in this embodiment, there might not be a plurality of passive devices 800, but rather only one passive device 800.

Figure 3:
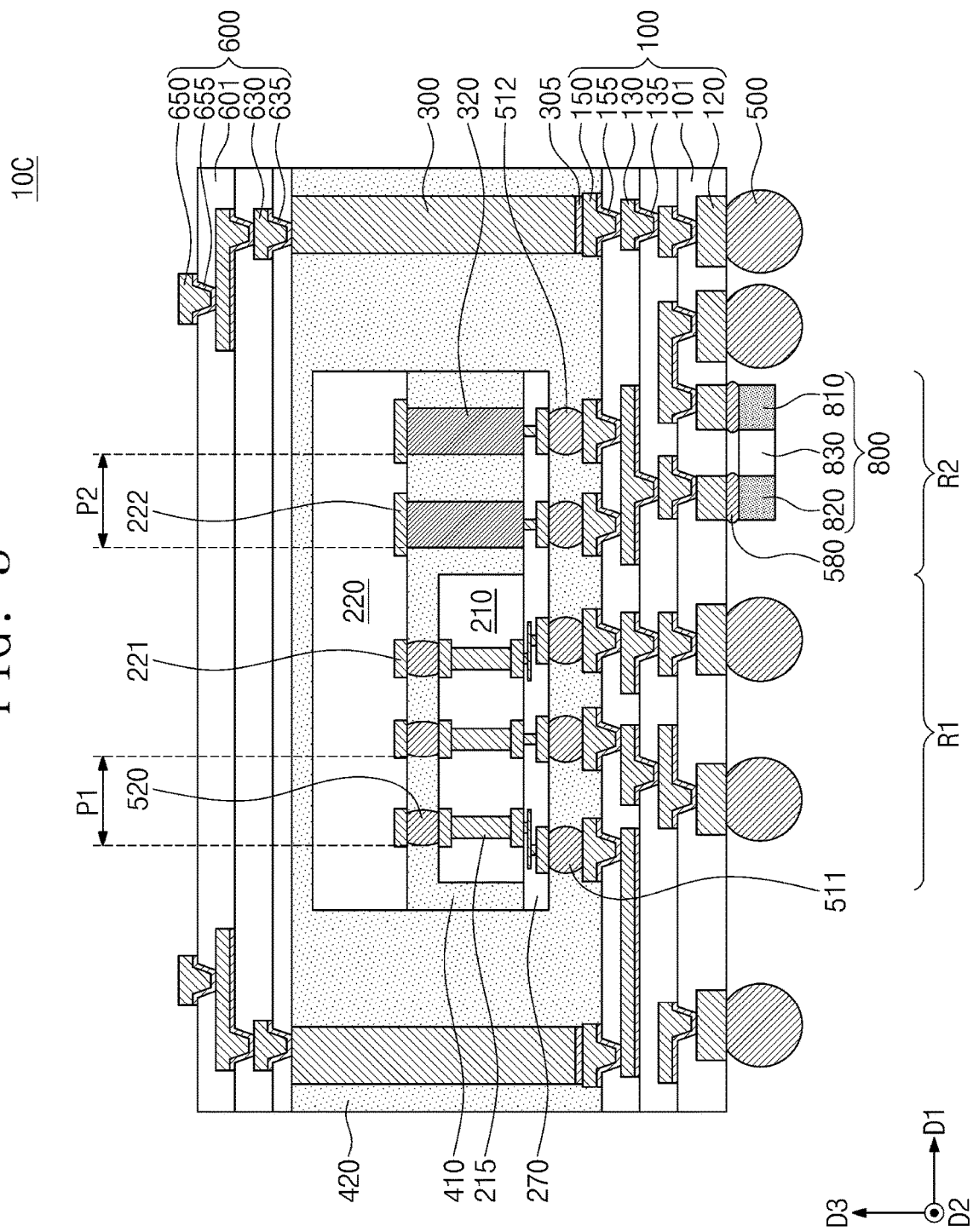
FIG. 3 is a cross-sectional view that illustrates a semiconductor package according to some embodiments of the inventive concepts.

FIG. 3 is a cross-sectional view that illustrates a semiconductor package according to some embodiments of the inventive concepts.

Referring to FIG. 3, a semiconductor package 10C may include the first redistribution substrate 100, the solder balls 500, the passive device 800, the first and second semiconductor chips 210 and 220, the first and second molding layers 410 and 420, a plurality of conductive posts 320, the connection structures 300, and the second redistribution substrate 600.

The second semiconductor chip 220 may have a first side surface and a second side surface opposite to the first side surface. A first region R1 of the second semiconductor chip 220 may be disposed adjacent to the first side surface of the second semiconductor chip 220. A second region R2 of the second semiconductor chip 220 may be disposed adjacent to the second side surface of the second semiconductor chip 220. For example, the second region R2 of the second semiconductor chip 220 may be provided between the first region R1 and the second side surface of the second semiconductor chip 220 when viewed in a plan view.

The first semiconductor chip 210 may be disposed between the top surface of the first redistribution substrate 100 and a bottom surface of the second semiconductor chip 220 in the first region R1.

Each of the conductive posts 320 may be the same or similar as the conductive post 320 described in the embodiments of FIGS. 1A and 1B. However, the conductive posts 320 may be disposed between the top surface of the first redistribution substrate 100 and a bottom surface of the second semiconductor chip 220 in the second region R2. The conductive posts 320 may be disposed at a side of the first semiconductor chip 210.

A pitch P2 of the conductive posts 320 may be greater than a pitch of the through vias 215. The pitch P2 of the conductive posts 320 may be a distance between first side surfaces of the conductive posts 320 that are adjacent to each other. The first side surfaces of the conductive posts 320 may face a direction opposite to the first direction D1. The pitch P2 of the conductive posts 320 may be greater than a pitch P1 of the solder bumps 520.

The passive device 800 may be disposed on the bottom surface of the first redistribution substrate 100 and may be electrically connected to the plurality of conductive posts 320. Accordingly, the same voltage may be applied to the conductive posts 320. Alternatively, the passive device 800 may be electrically connected to a single conductive post 320.

Figure 4A:
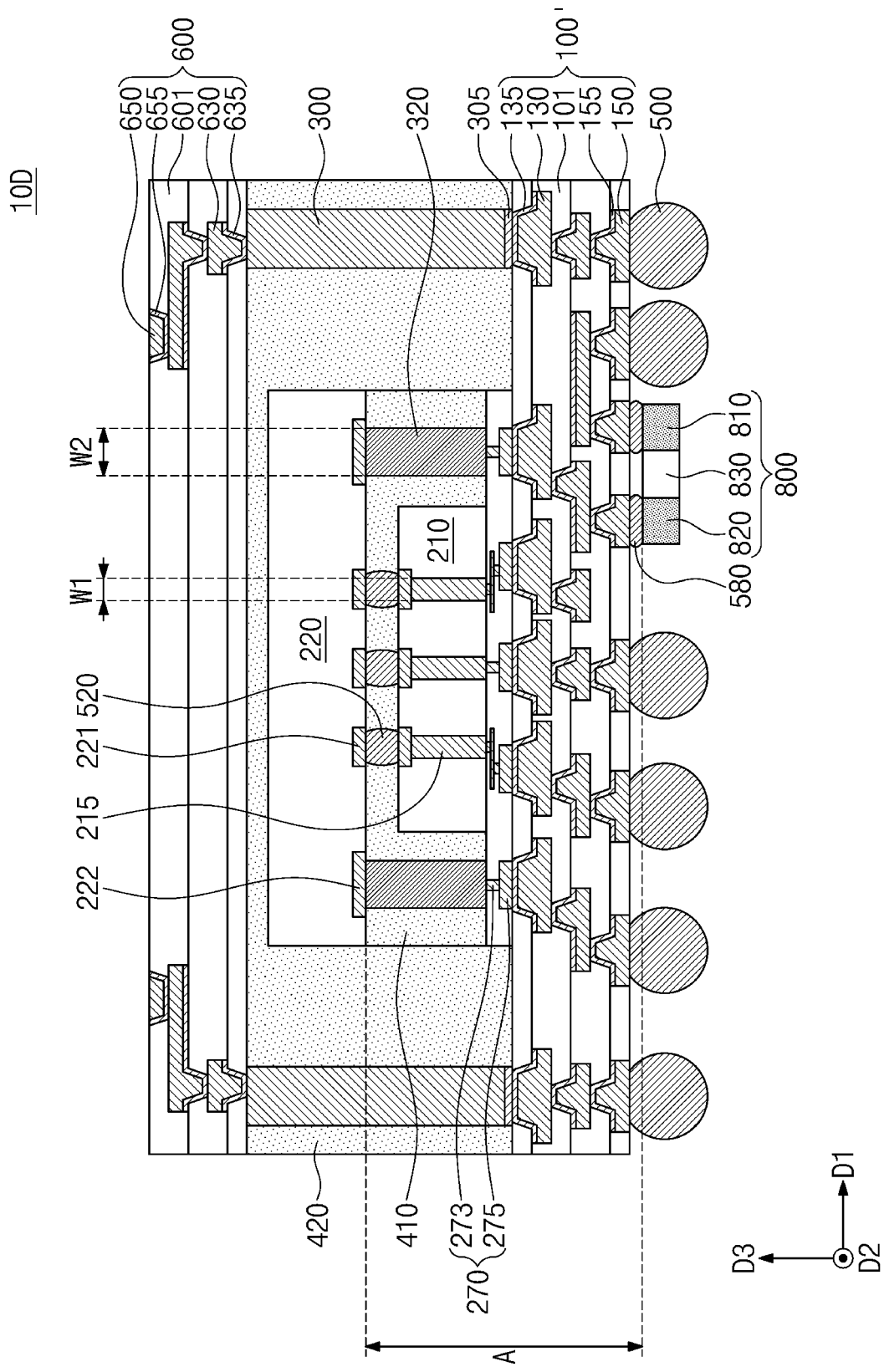
FIG. 4A is a cross-sectional view that illustrates a semiconductor package according to some embodiments of the inventive concepts.

FIG. 4A is a cross-sectional view that illustrates a semiconductor package according to some embodiments of the inventive concepts. Hereinafter, one of the conductive posts 320 will be described for the purpose of ease and convenience in explanation.

Referring to FIG. 4A, a semiconductor package 10D may include a first redistribution substrate 100', the solder balls 500, the passive device 800, the first and second semiconductor chips 210 and 220, the first and second molding layers 410 and 420, the conductive post 320, the connection structures 300, and the second redistribution substrate 600. However, the semiconductor package 10D might not include the first bumps 511 and the second bump 512 described with reference to FIGS. 1A and 1B.

The first redistribution substrate 100' may include the first insulating layers 101, the first redistribution patterns 130, the first seed patterns 135, the first seed pads 155, and the first redistribution pads 150. However, the first redistribution substrate 100' might not include the under bump patterns 120 described with reference to FIGS. 1A and 1B. The first redistribution substrate 100' may be in direct contact with the lower redistribution layer 270 and the second molding layer 420. For example, an uppermost first insulating layer 101 may be in direct contact with a bottom surface of the lower redistribution layer 270 and a bottom surface of the second molding layer 420.

The first seed patterns 135 may be provided on top surfaces of the first redistribution patterns 130. Each of the first seed patterns 135 in the uppermost first insulating layer 101 may be connected to the lower redistribution pad 275 or the conductive seed pattern 305. For example, the first via portion of one of the uppermost first redistribution patterns 130 may vertically overlap with the lower redistribution pad 275, and the first via portion of another uppermost first redistribution patterns 130 may overlap with the conductive seed pattern 305.

In another embodiment, unlike FIG. 4A, the lower redistribution layer 270 may be omitted, and the first redistribution substrate 100' may be in direct contact with the first molding layer 410, the conductive post 320, and the first semiconductor chip 210.

The solder balls 500 may be disposed on bottom surfaces of the first redistribution pads 150 located at the lowermost level. The first redistribution pads 150 may function as pads of the solder balls 500.

The second redistribution pads 650 and the second seed pads 655 might not extend onto the top surface of the uppermost second insulating layer 601.

The semiconductor package 10D may be manufactured by, but is not necessarily limited to, a chip-first process.

Figure 4B:
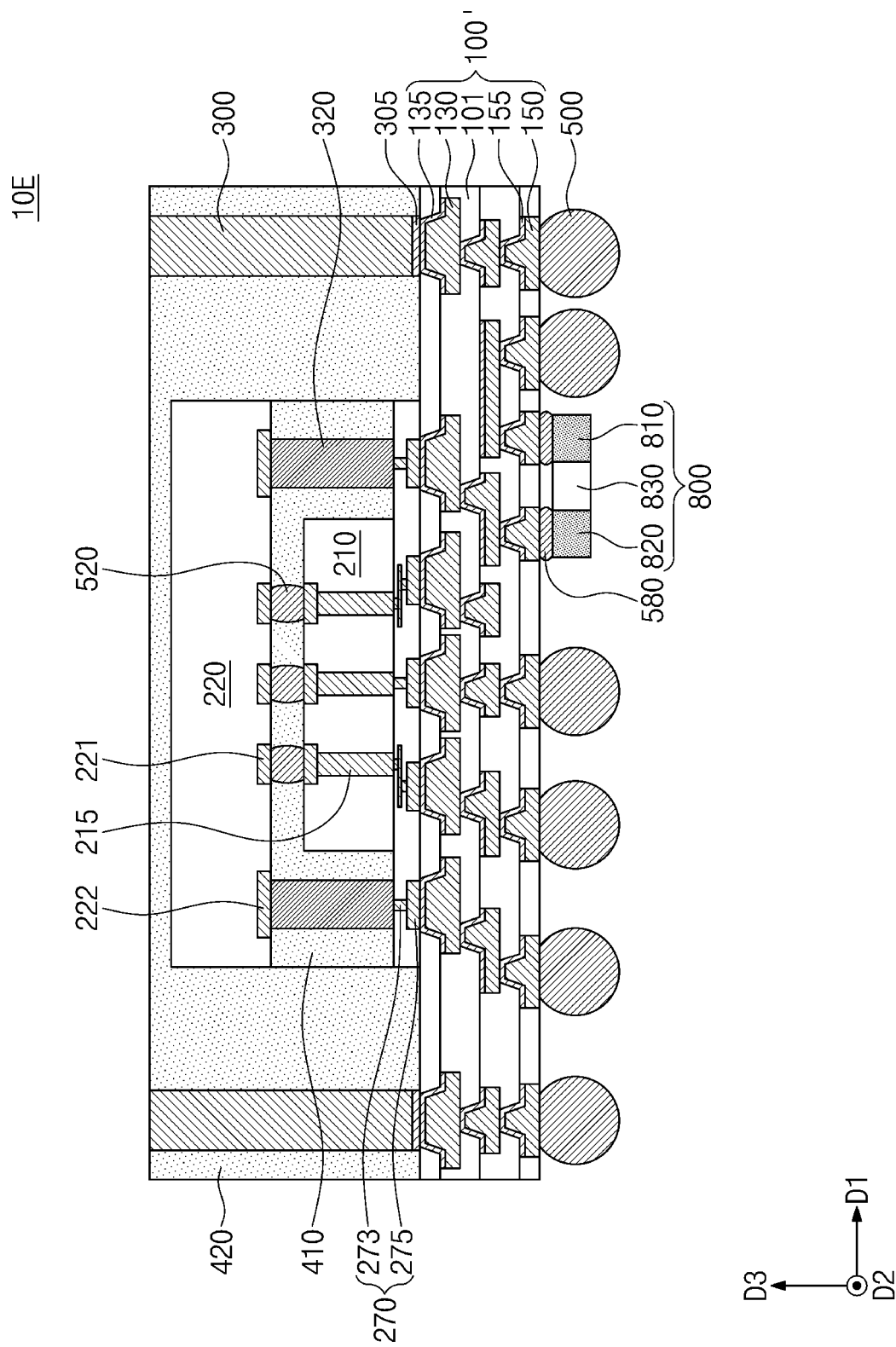
FIG. 4B is a cross-sectional view that illustrates a semiconductor package according to some embodiments of the inventive concepts.

FIG. 4B is a cross-sectional view that illustrates a semiconductor package according to some embodiments of the inventive concepts.

Referring to FIG. 4B, a semiconductor package 10E may include the first redistribution substrate 100', the solder balls 500, the passive device 800, the first and second semiconductor chips 210 and 220, the first and second molding layers 410 and 420, the conductive post 320, and the connection structures 300. The semiconductor package 10E might not include the first bumps 511, the second bump 512 and the second redistribution substrate 600, described with reference to FIGS. 1A and 1B.

The embodiments of the inventive concepts may be combined with each other. For example, the semiconductor package 10 of FIG. 1A, the semiconductor package 10A of FIG. 2A, the semiconductor package 10B of FIG. 2B or the semiconductor package 10C of FIG. 3 might not include the second redistribution substrate 600. For certain examples, the semiconductor package 10A of FIG. 2A, the semiconductor package 10B of FIG. 2B or the semiconductor package 10C of FIG. 3 may include the first redistribution substrate 100' described in the embodiments of FIG. 4A. Accordingly, features and aspects of the embodiments of the inventive concepts may be variously combined with each other.

Figure 5A:
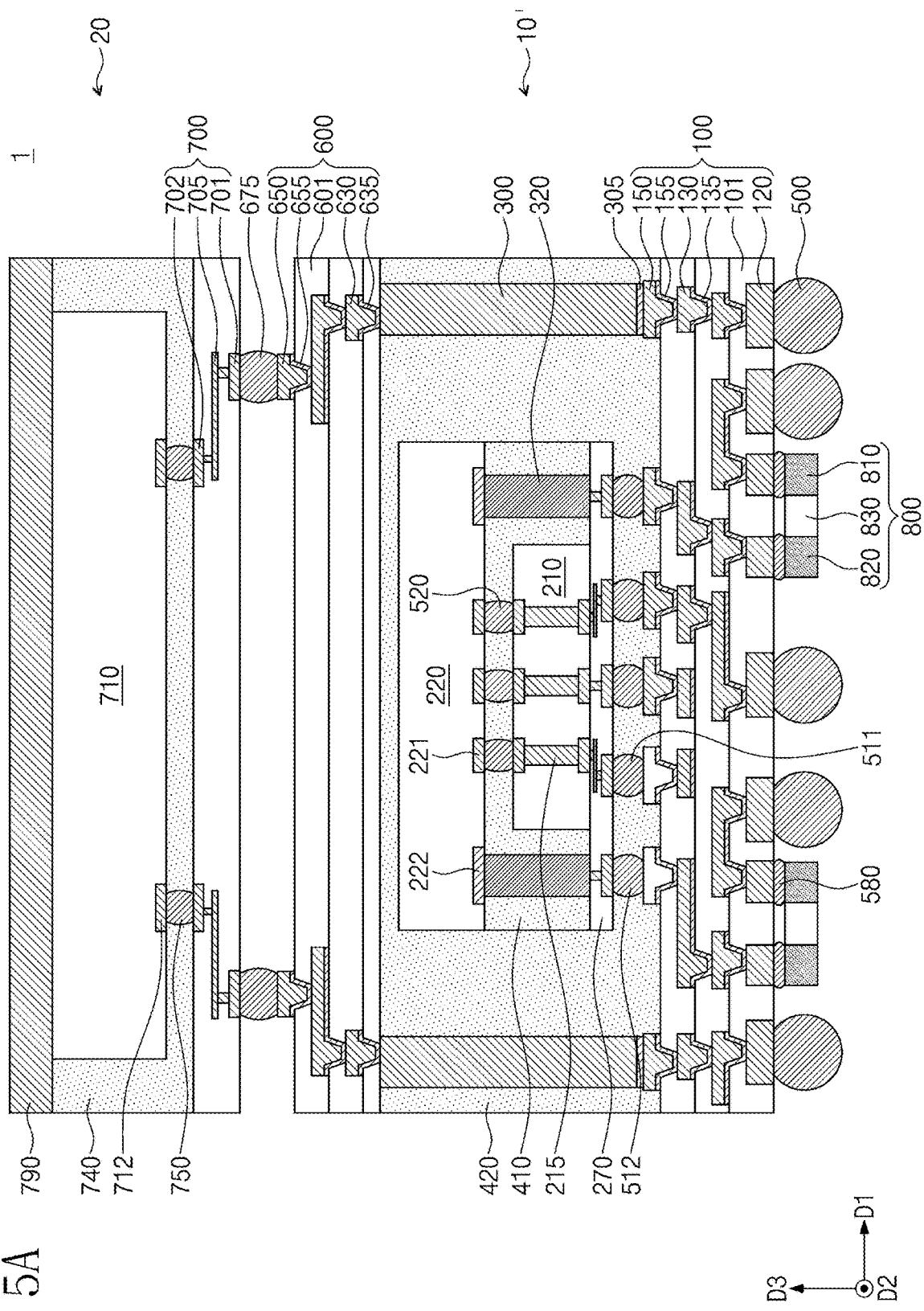
FIG. 5A is a cross-sectional view that illustrates a semiconductor package according to some embodiments of the inventive concepts.

FIG. 5A is a cross-sectional view that illustrates a semiconductor package according to some embodiments of the inventive concepts.

Referring to FIG. 5A, a semiconductor package 1 may include a lower package 10' and an upper package 20. The lower package 10' may be substantially the same as the semiconductor package 10 described with reference to FIGS. 1A and 1B. For example, the lower package 10' may include the first redistribution substrate 100, the solder balls 500, the passive device 800, the first and second semiconductor chips 210 and 220, the first and second molding layers 410 and 420, the conductive post 320, the connection structures 300, and the second redistribution substrate 600. In certain embodiments, the lower package 10' may be substantially the same as the semiconductor package 10A of FIG. 2A, the semiconductor package 10B of FIG. 2B, the semiconductor package 10C of FIG. 3, or the semiconductor package 10D of FIG. 4A.

The upper package 20 may include an upper substrate 700, an upper semiconductor chip 710, and an upper molding layer 740. The upper substrate 700 may be disposed on a top surface of the second redistribution substrate 600, and may be spaced apart from the top surface of the second redistribution substrate 600. The upper substrate 700 may be a printed circuit board (PCB) and/or a redistribution layer. First substrate pads 701 and second substrate pads 702 may be disposed on a bottom surface and a top surface of the upper substrate 700, respectively. Metal lines 705 may be provided in the upper substrate 700 and may be connected to the first substrate pads 701 and the second substrate pads 702.

The upper semiconductor chip 710 may be mounted on the top surface of the upper substrate 700. The upper semiconductor chip 710 may include upper chip pads 712 on its bottom surface. Unlike FIG. 5A, the upper semiconductor chip 710 may be provided as a plurality of upper semiconductor chips 710. The plurality of upper semiconductor chips 710 may be vertically stacked. Alternatively, the plurality of upper semiconductor chips 710 may be laterally spaced apart from each other. Hereinafter, a single upper semiconductor chip 710 will be described for the purpose of ease and convenience in explanation.

The upper package 20 may further include upper bumps 750. The upper bumps 750 may be provided between the upper substrate 700 and the upper semiconductor chip 710, and may be disposed between and connected to the second substrate pads 702 and the upper chip pads 712. The upper bumps 750 may include a solder material. The upper bumps 750 may further include pillar patterns.

Connection bumps 675 may be disposed between the second redistribution substrate 600 and the upper substrate 700. For example, the connection bumps 675 may be provided between the second redistribution pads 650 and the first substrate pads 701, and may be disposed between and connected to the second redistribution pads 650 and the first substrate pads 701. Accordingly, the upper semiconductor chip 710 may be electrically connected to the second semiconductor chip 220, the first semiconductor chip 210, and/or the solder balls 500 through the connection bumps 675.

The upper molding layer 740 may be provided on the upper substrate 700 and may cover the upper semiconductor chip 710. The upper molding layer 740 may expose a top surface of the upper semiconductor chip 710. Alternatively, the upper molding layer 740 may cover the top surface of the upper semiconductor chip 710. The upper molding layer 740 may include an insulating polymer such as an epoxy molding compound.

The upper package 20 may further include a heat dissipation structure 790. The heat dissipation structure 790 may be disposed on the top surface of the upper semiconductor chip 710 and on a top surface of the upper molding layer 740. In certain embodiments, the heat dissipation structure 790 may further extend onto a side surface of the upper molding layer 740. The heat dissipation structure 790 may include a heat sink, a heat slug, or a thermal interface material (TIM) layer. For example, the heat dissipation structure 790 may include a metal.

Figure 5B:
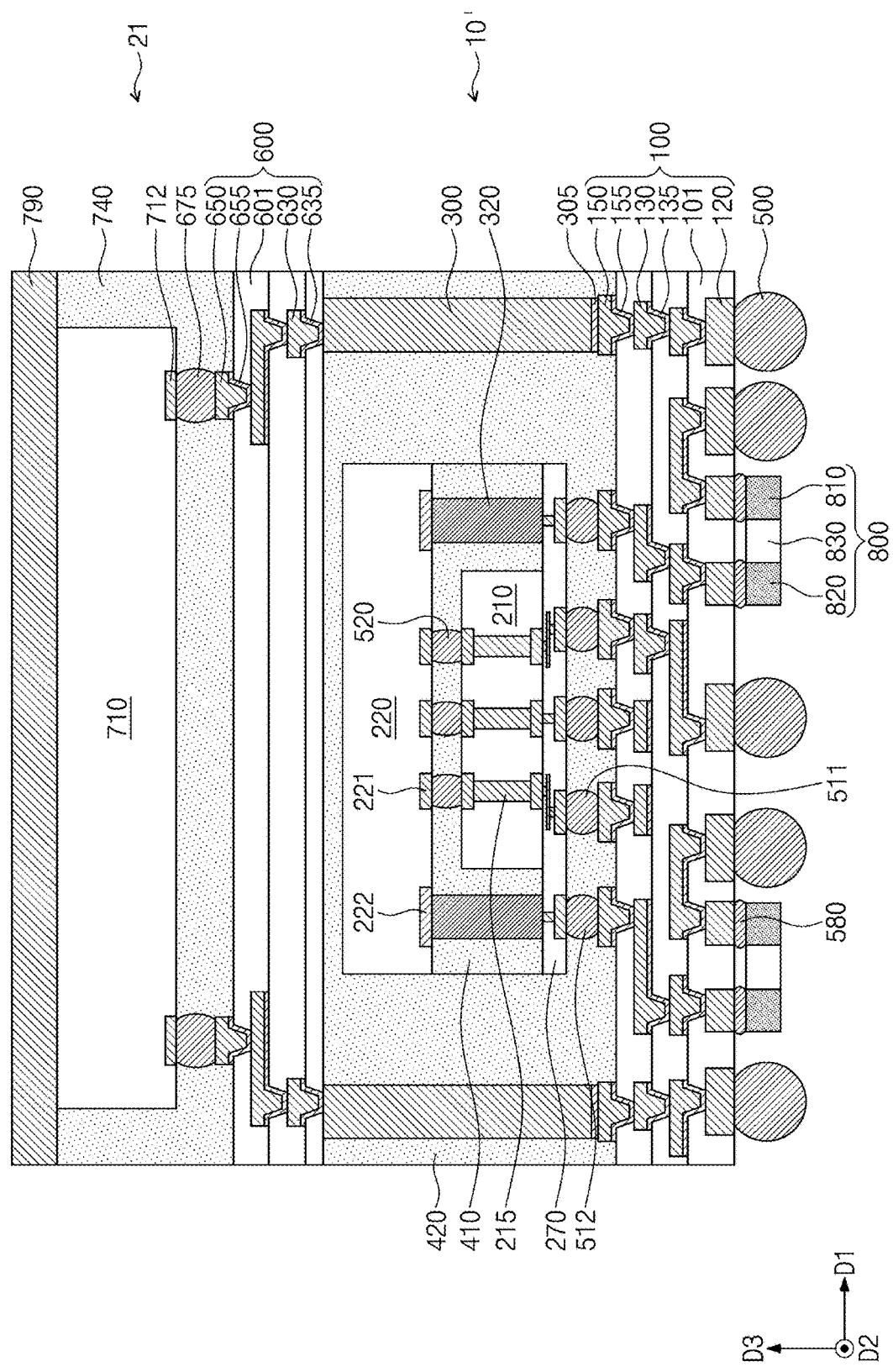
FIG. 5B is a cross-sectional view that illustrates a semiconductor package according to some embodiments of the inventive concepts.

FIG. 5B is a cross-sectional view that illustrates a semiconductor package according to some embodiments of the inventive concepts.

Referring to FIG. 5B, a semiconductor package 2 may include a lower package 10' and an upper package 21. The lower package 10' may be substantially the same as described in the embodiments of FIG. 5A.

The upper package 21 may include the upper semiconductor chip 710 and the upper molding layer 740. The upper package 21 may further include the heat dissipation structure 790. However, the upper package 21 might not include the upper substrate 700 and the upper bumps 750, described with reference to FIG. 5A. The upper semiconductor chip 710 may be disposed on the top surface of the second redistribution substrate 600. The connection bumps 675 may be disposed between the second redistribution substrate 600 and the upper semiconductor chip 710, and may be connected to the second redistribution pads 650 and the upper chip pads 712. In this embodiment, the upper molding layer 740 may be disposed directly on the second redistribution substrate 600. The upper molding layer 740 may further extend onto a bottom surface of the upper semiconductor chip 710 to seal and/or at least partially encapsulate the connection bumps 675. Alternatively, an underfill pattern may be disposed between the second redistribution substrate 600 and the upper semiconductor chip 710.

Figure 5C:
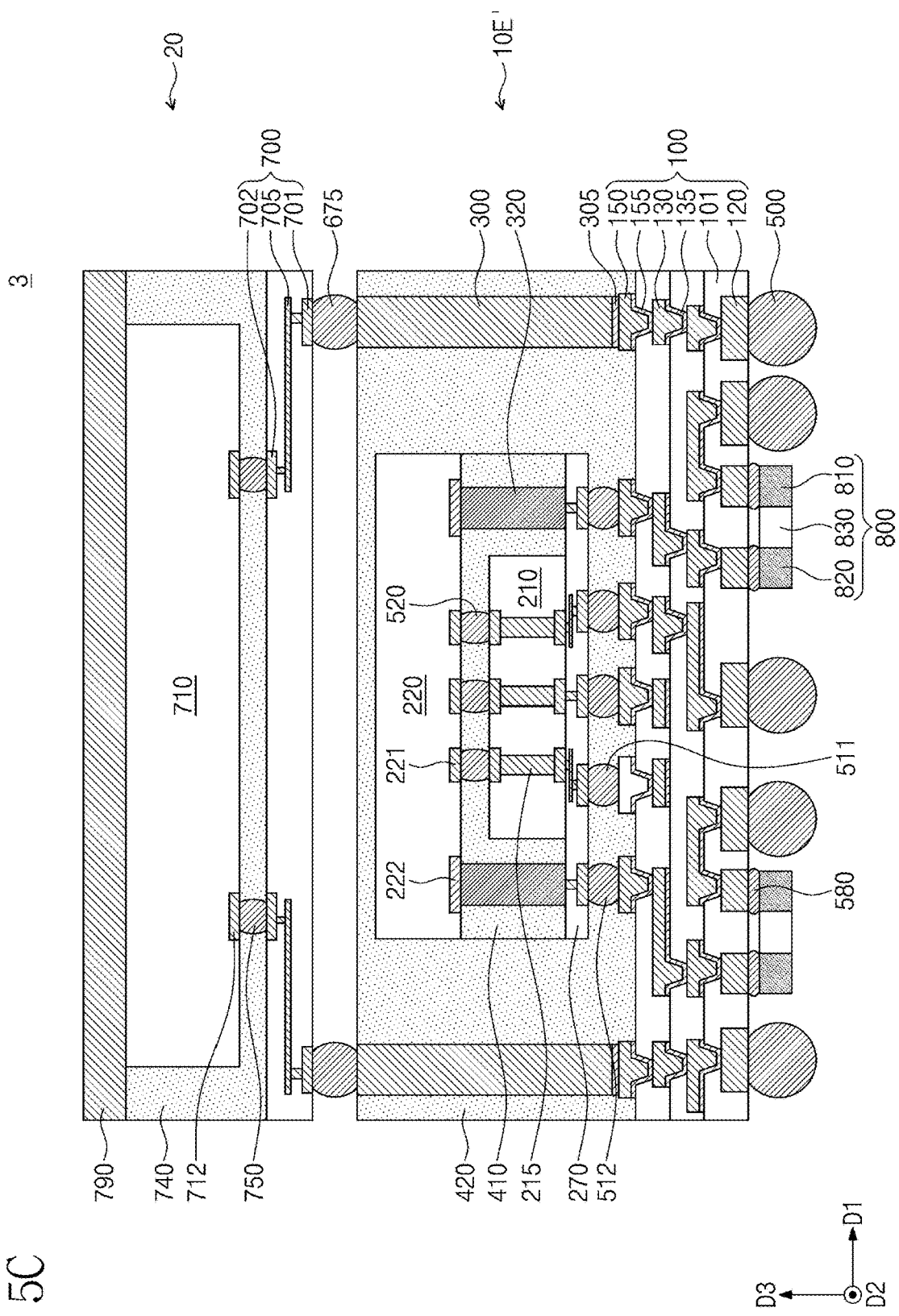
FIG. 5C is a cross-sectional view that illustrates a semiconductor package according to some embodiments of the inventive concepts.

FIG. 5C is a cross-sectional view that illustrates a semiconductor package according to some embodiments of the inventive concepts.

Referring to FIG. 5C, a semiconductor package 3 may include a lower package 10E' and an upper package 20. The lower package 10E' may be substantially the same as the semiconductor package 10E described in the embodiments of FIG. 4B. The upper package 20 may be substantially the same as the upper package 20 described in the embodiments of FIG. 5A.

However, the connection bumps 675 may be disposed between the connection structures 300 and the upper substrate 700 and may be connected to the connection structures 300 and the first substrate pads 701. For example, the connection bumps 675 may be in direct contact with the top surfaces of the connection structures 300.

The components of the semiconductor package 1 of FIG. 5A, the components of the semiconductor package 2 of FIG. 5B and/or the components of the semiconductor package 3 of FIG. 5C may be combined with each other. For example, the semiconductor package 3 of FIG. 5C may include the upper package 21 of FIG. 5B. Accordingly, features and aspects of the embodiments of FIGS. 5A to 5C may be variously combined with each other.

Hereinafter, a method of manufacturing a semiconductor package according to some embodiments of the inventive concepts will be described.

FIGS. 6A to 6I are views that illustrate a method of manufacturing a semiconductor package according to some embodiments of the inventive concepts.

Figure 6A:
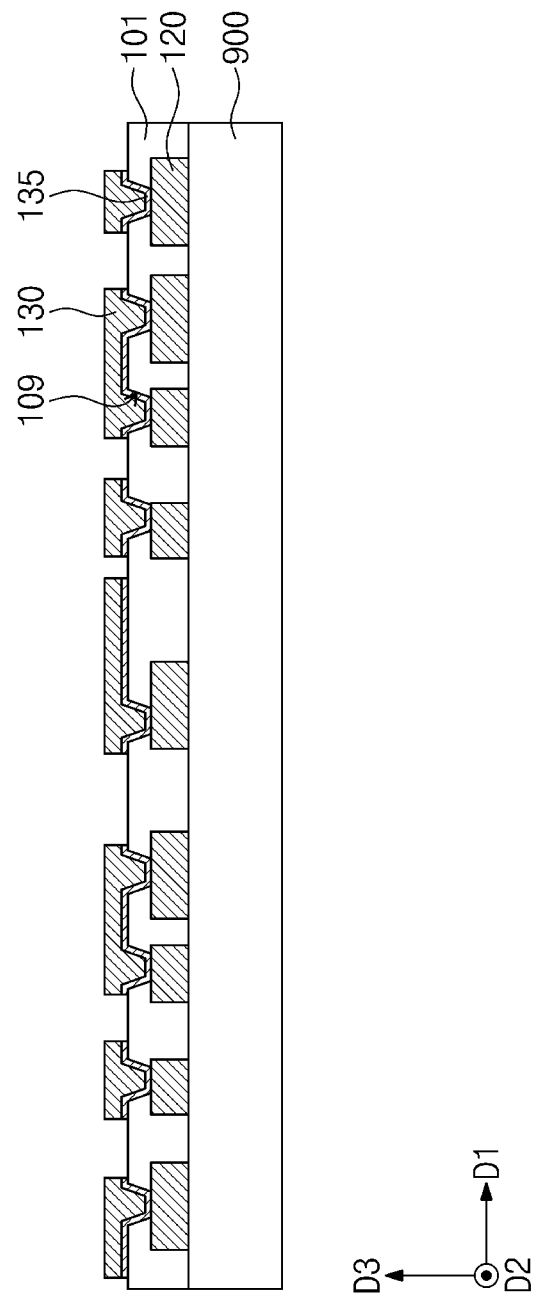
FIGS. 6A to 6I are views that illustrate a method of manufacturing a semiconductor package according to some embodiments of the inventive concepts.

Referring to FIG. 6A, under bump patterns 120, a first insulating layer 101, first seed patterns 135 and first redistribution patterns 130 may be formed on a carrier substrate 900.

In some embodiments, the under bump patterns 120 may be formed on the carrier substrate 900 by an electroplating process. The first insulating layer 101 may be formed on the carrier substrate 900 to cover side surfaces and top surfaces of the under bump patterns 120. For example, the first insulating layer may at least partially cover the top surfaces and/or side surfaces of the under bump patterns 120. First openings 109 may be formed in the first insulating layer 101 to expose the under bump patterns 120.

The first seed patterns 135 may be conformally formed in the first openings 109 and on a top surface of the first insulating layer 101. An electroplating process using the first seed patterns 135 as an electrode may be performed to form the first redistribution patterns 130. The first redistribution patterns 130 may be formed in the first openings 109 and on the top surface of the first insulating layer 101 to cover the first seed patterns 135. Each of the first redistribution patterns 130 may include a first via portion and a first interconnection portion. The first via portion may be formed in a corresponding first opening 109. The first interconnection portion may be formed on the first via portion and may extend onto the top surface of the first insulating layer 101.

Figure 6B:
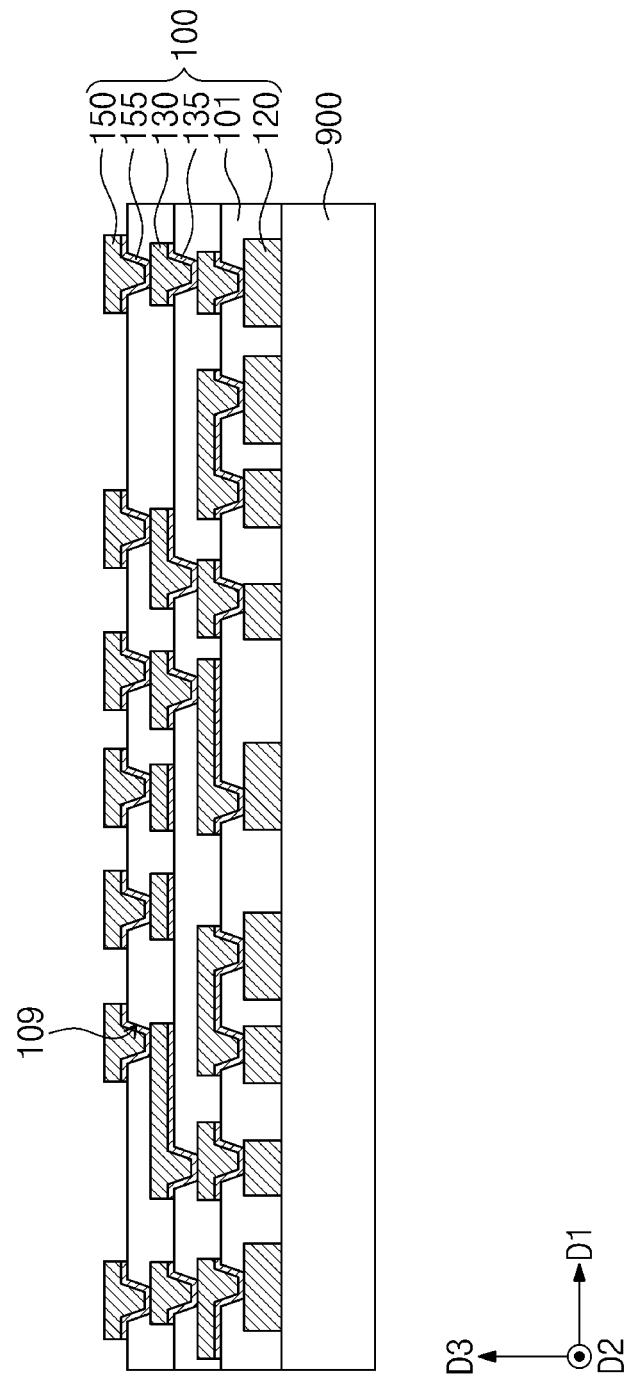

Referring to FIG. 6B, the process of forming the first insulating layer 101, the process of forming the first seed patterns 135 and the process of forming the first redistribution patterns 130 may be repeatedly performed to form the first insulating layers 101, which are stacked sequentially, and the first redistribution patterns 130, which are stacked sequentially.

First redistribution pads 150 may be formed in the first openings 109 of an uppermost first insulating layer 101, respectively, and may be connected to the first redistribution patterns 130. First seed pads 155 may be formed before the formation of the first redistribution pads 150. An electroplating process using the first seed pads 155 as an electrode may be performed to form the first redistribution pads 150. Accordingly, a first redistribution substrate 100 may be manufactured. The first redistribution substrate 100 may include the first insulating layers 101, the under bump patterns 120, the first seed patterns 135, the first redistribution patterns 130, the first seed pads 155, and the first redistribution pads 150.

Figure 6C:
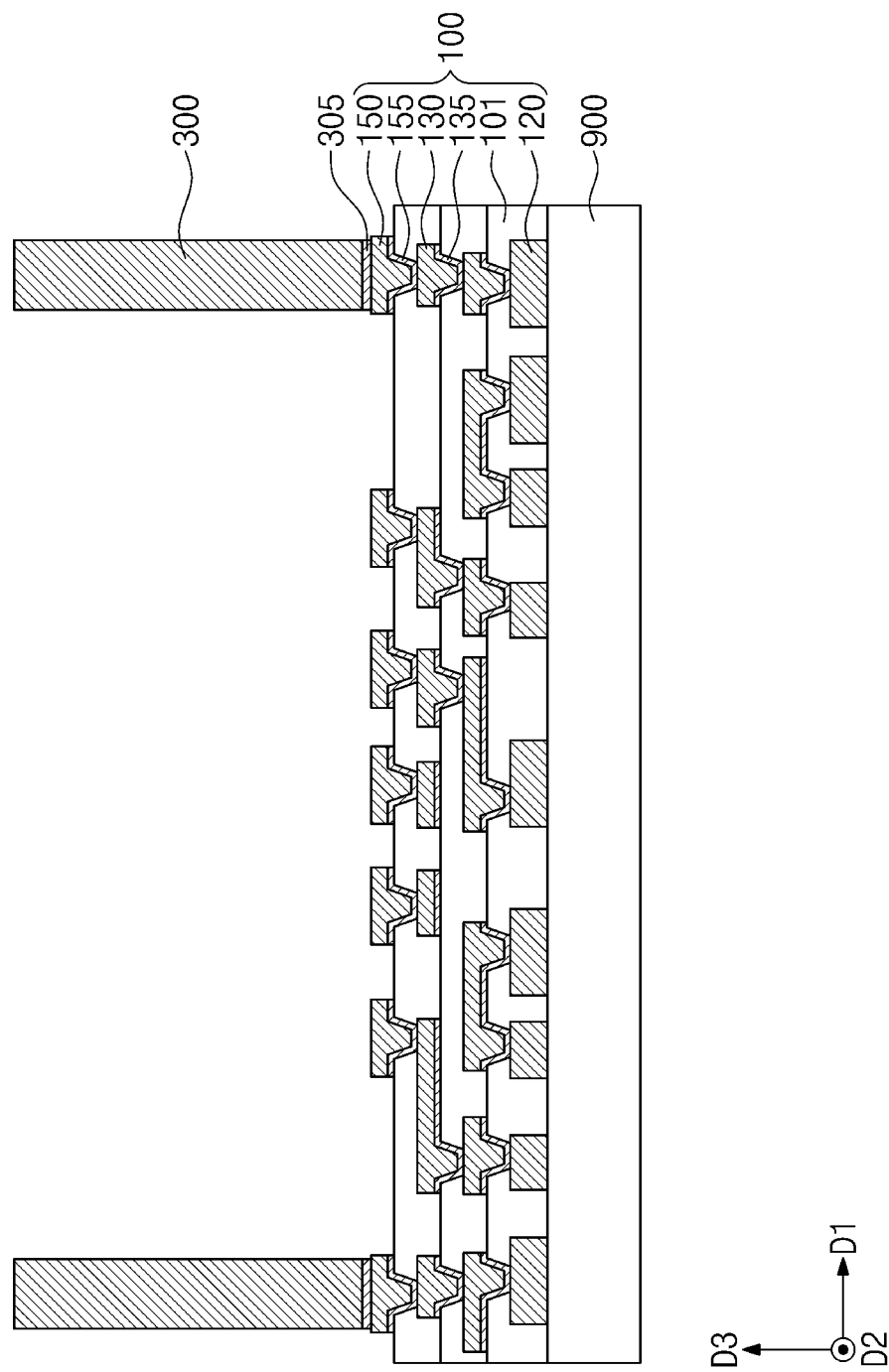

Referring to FIG. 6C, conductive seed patterns 305 may be formed on the first redistribution pads 150 of an edge region of the first redistribution substrate 100. An electroplating process using the conductive seed patterns 305 as an electrode may be performed to form connection structures 300. Accordingly, the connection structures 300 may be formed on the conductive seed patterns 305. The conductive seed patterns 305 and the connection structures 300 might not be formed on the first redistribution pads 150 of a center region of the first redistribution substrate 100.

Figure 6D:
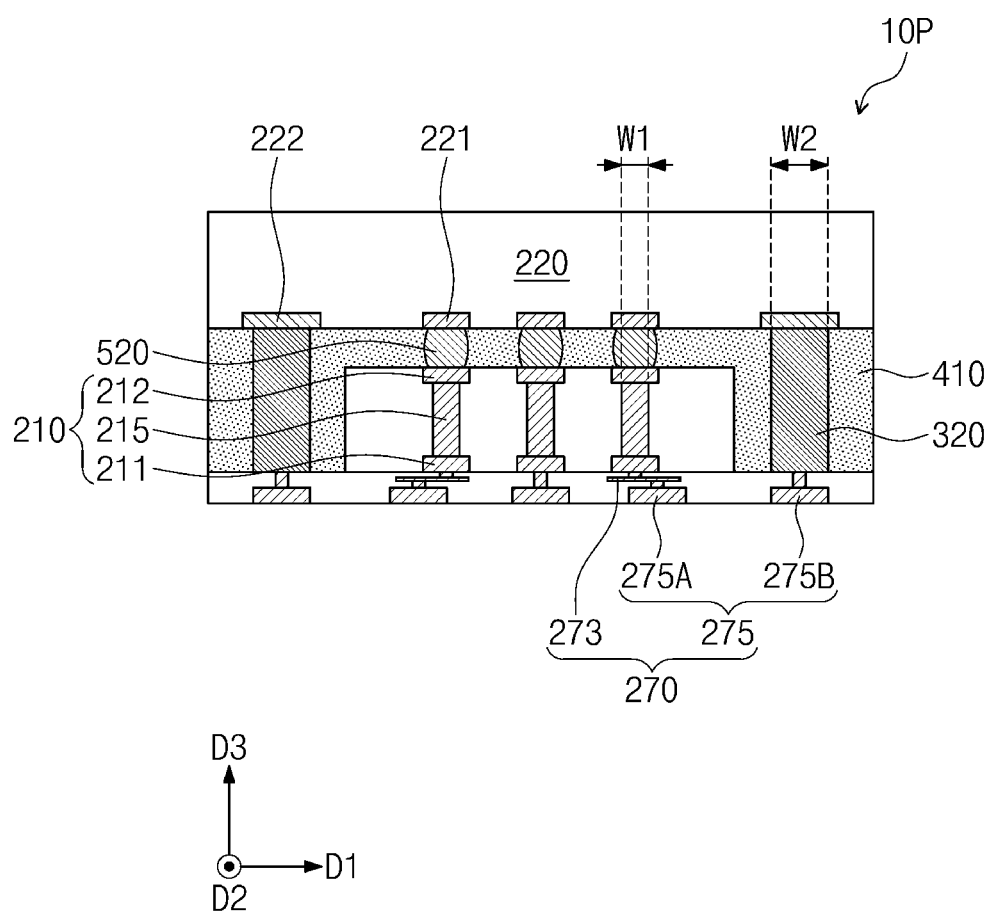

Referring to FIG. 6D, a preliminary package 10P may be formed. The formation of the preliminary package 10P may include mounting a first semiconductor chip 210 on a bottom surface of a second semiconductor chip 220, disposing a conductive post 320 on the bottom surface of the second semiconductor chip 220, forming a first molding layer 410 on the bottom surface of the second semiconductor chip 220, to fully or partially cover a side surface of the first semiconductor chip 210 and a side surface of the conductive post 320, and forming a lower redistribution layer 270. After the formation of the first molding layer 410, a grinding process may be performed on a bottom surface of the first molding layer 410. Accordingly, the bottom surface of the first molding layer 410 may be coplanar with a bottom surface of the conductive post 320 and a bottom surface of the first semiconductor chip 210. After the grinding process, the lower redistribution layer 270 may be formed on the bottom surface of the first molding layer 410, the bottom surface of the conductive post 320, and the bottom surface of the first semiconductor chip 210. The lower redistribution layer 270 may include lower redistribution patterns 273 and lower redistribution pads 275. The lower redistribution pads 275 may include first lower redistribution pads 275A and second lower redistribution pads 275B.

Figure 6E:
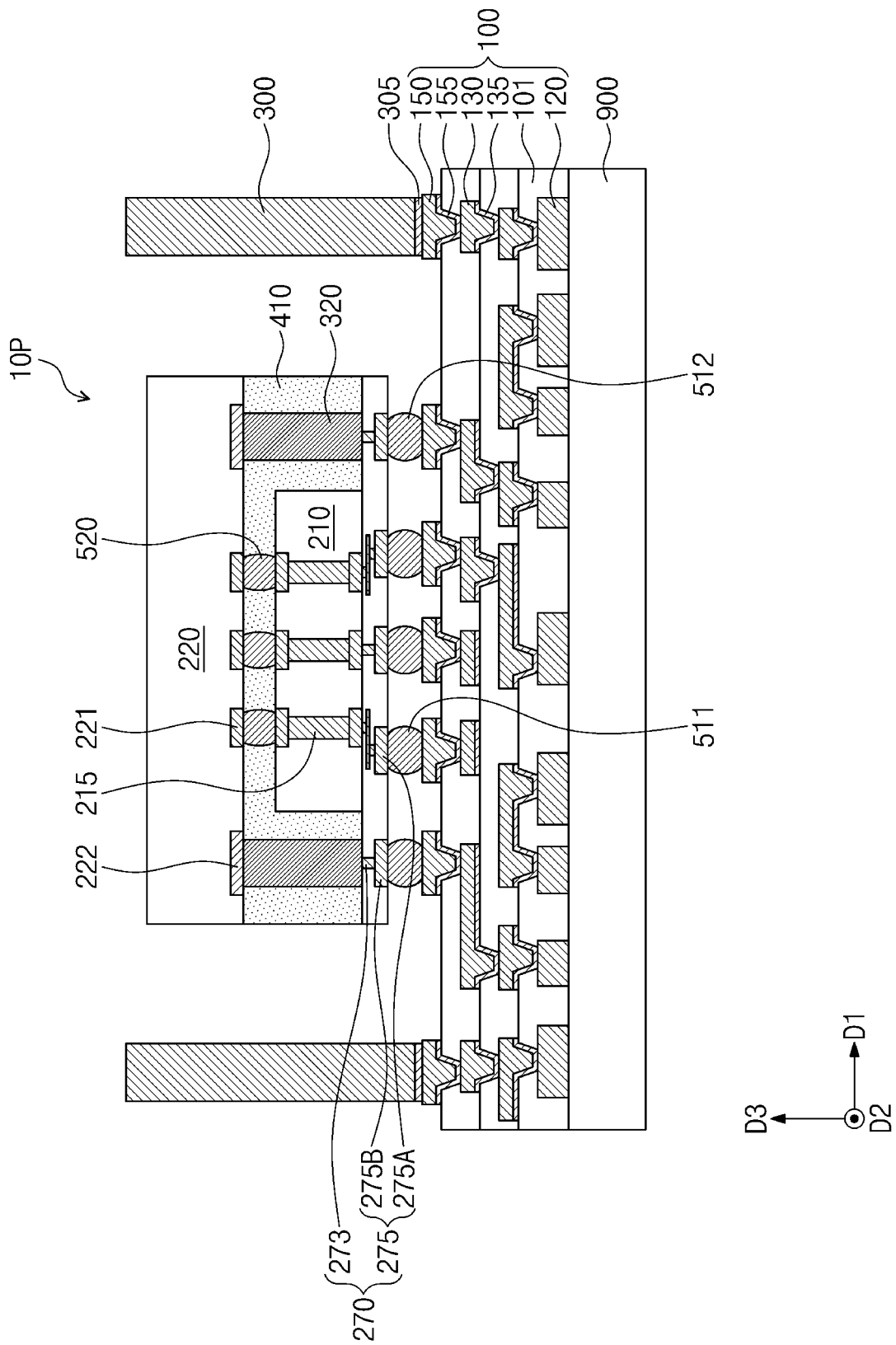

Referring to FIG. 6E, the preliminary package 10P may be mounted on the top surface of the first redistribution substrate 100. For example, the preliminary package 10P may be disposed on the first redistribution substrate 100 in such a way that the lower redistribution layer 270 faces the first redistribution substrate 100. For example, the lower redistribution layer 270 may be adjacent to the first redistribution substrate 100. First bumps 511 may be formed between the first lower redistribution pads 275A and corresponding first redistribution pads 150. A second bump 512 may be formed between the second lower redistribution pad 275B and a corresponding first redistribution pad 150. Accordingly, the first semiconductor chip 210, the second semiconductor chip 220 and the conductive post 320 may be electrically connected to the first redistribution substrate 100.

Figure 6F:
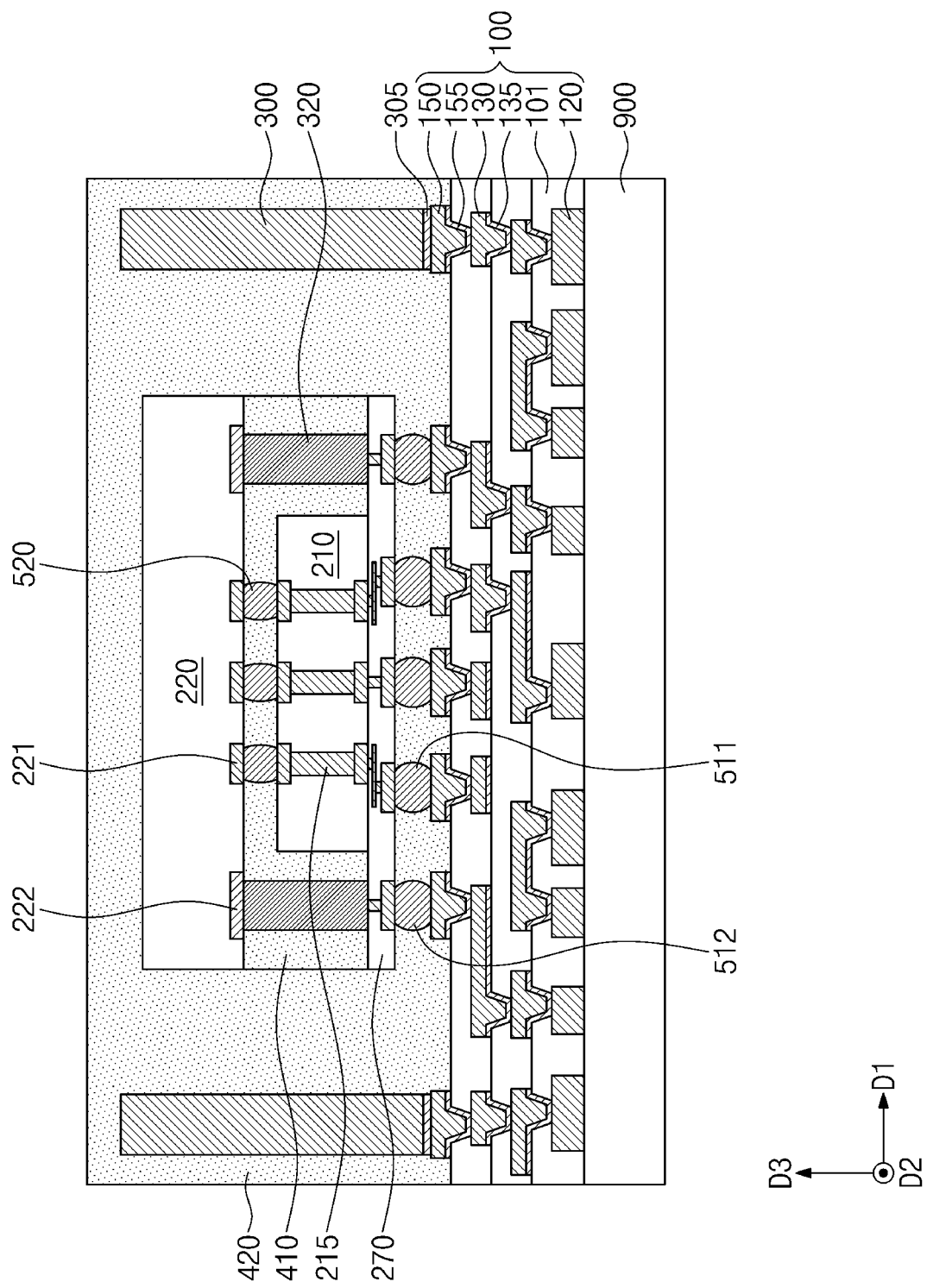

Referring to FIG. 6F, a second molding layer 420 may be formed on the top surface of the first redistribution substrate 100 to cover the lower redistribution layer 270, the first molding layer 410, the second semiconductor chip 220, and the connection structures 300. The second molding layer 420 may cover a top surface of the second semiconductor chip 220 and top surfaces of the connection structures 300. A top surface of the second molding layer 420 may be located at a higher level than the top surface of the second semiconductor chip 220 and the top surfaces of the connection structures 300. The second molding layer 420 may further extend onto a bottom surface of the lower redistribution layer 270 to cover the first bumps 511 and the second bump 512.

Figure 6G:
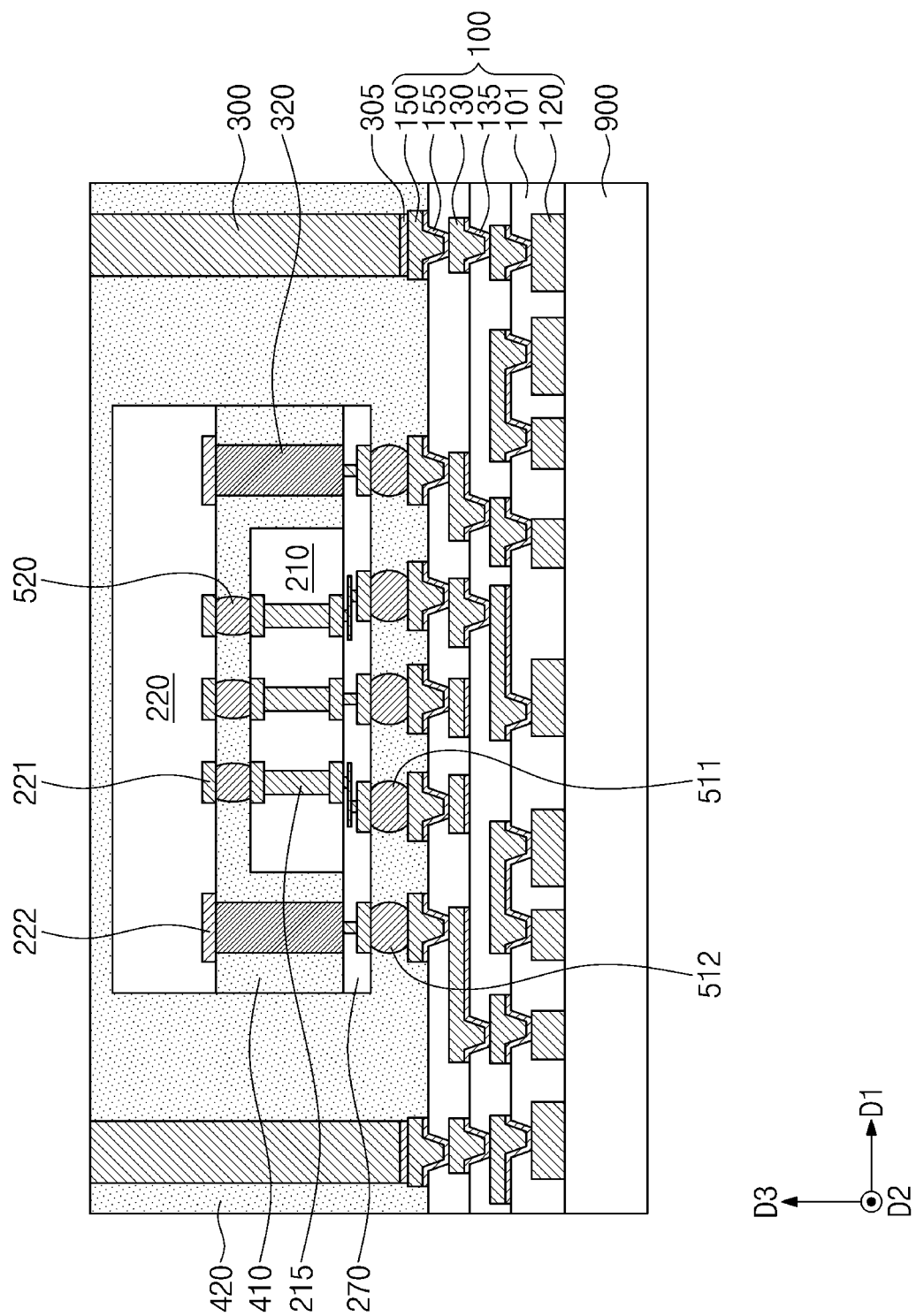

Referring to FIG. 6G, a grinding process may be performed on the second molding layer 420 to expose the top surfaces of the connection structures 300. For example, the grinding process may be performed by a chemical mechanical polishing (CMP) process. After the grinding process, the exposed top surfaces of the connection structures 300 may be at substantially the same level as a top surface of the second molding layer 420. The top surface of the second semiconductor chip 220 may be covered by the second molding layer 420. In some embodiments, the top surface of the second semiconductor chip 220 might not be covered by the second molding layer 420 and may be exposed to the outside.

Figure 6H:
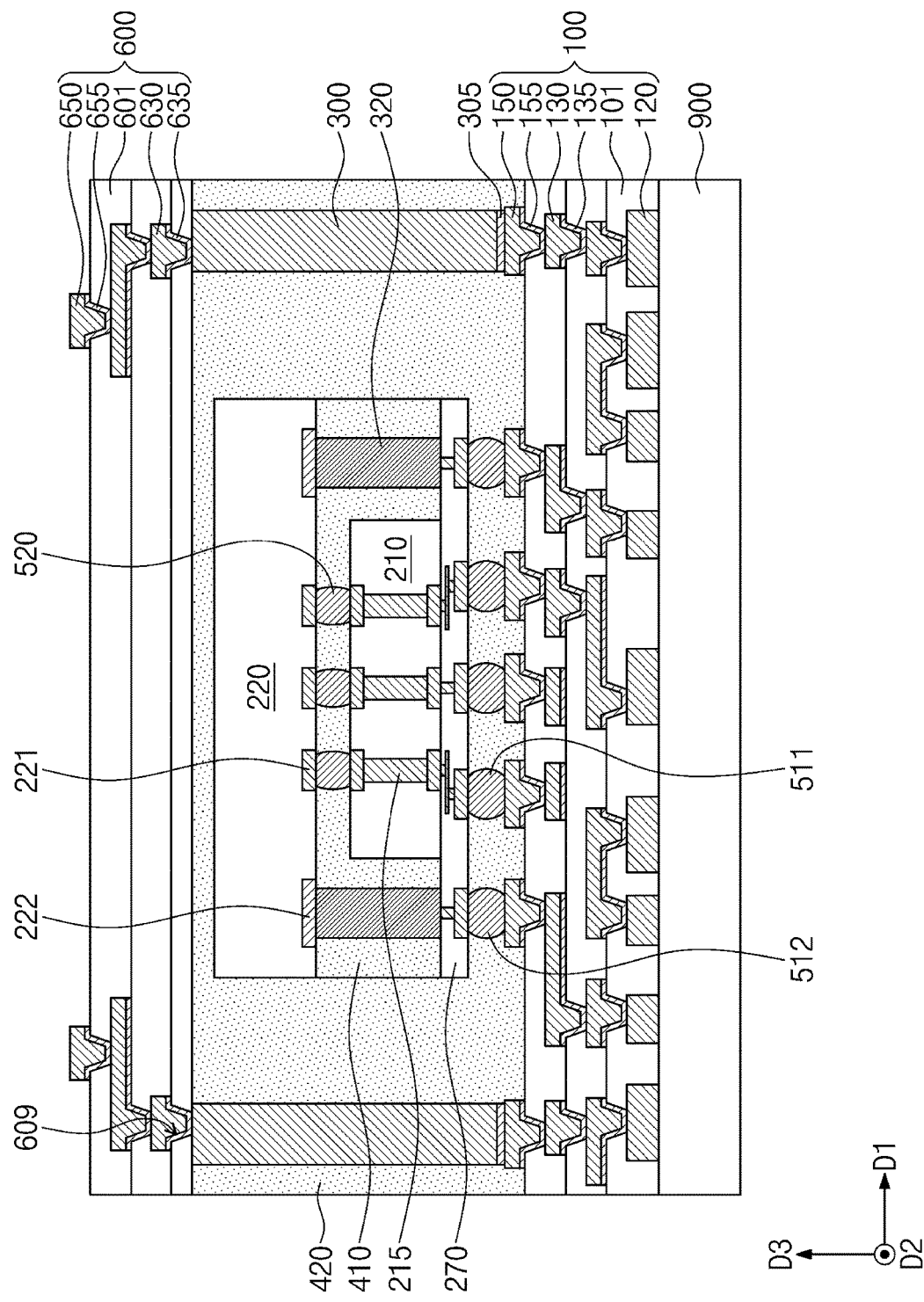

Referring to FIG. 6H, a second insulating layer 601, second seed patterns 635, second redistribution patterns 630, second seed pads 655 and second redistribution pads 650 may be formed on the second molding layer 420 and the connection structures 300 to manufacture a second redistribution substrate 600.

In some embodiments, the second insulating layer 601 may be formed on the top surface of the second molding layer 420. Second openings 609 may be formed in the second insulating layer 601 to expose the top surfaces of the connection structures 300, respectively. The second seed patterns 635 may be conformally formed in the second openings 609 and on a top surface of the second insulating layer 601. The second redistribution patterns 630 may be formed in the second openings 609 and on the top surface of the second insulating layer 601 to cover the second seed patterns 635. Each of the second redistribution patterns 630 may include a second via portion and a second interconnection portion. The second via portion may be formed in a corresponding second opening 609. The second interconnection portion may be formed on the second via portion and may extend onto the top surface of the second insulating layer 601. Processes of forming the second seed patterns 635 and the second redistribution patterns 630 may be the same or similar to the processes of forming the first seed patterns 135 and the first redistribution patterns 130 of FIG. 6A, respectively. The process of forming the second insulating layer 601, the process of forming the second seed patterns 635, and the process of forming the second redistribution patterns 630 may be performed repeatedly to form a plurality of the stacked second insulating layers 601 and a plurality of the stacked second redistribution patterns 630.

The second redistribution pads 650 may be formed in an uppermost second insulating layer 601 and on a top surface of the uppermost second insulating layer 601. Second seed pads 655 may be formed before the formation of the second redistribution pads 650. The second redistribution pads 650 may be formed by an electroplating process using the second seed pads 655 as an electrode. Accordingly, the second redistribution substrate 600 may be manufactured. The second redistribution substrate 600 may include the second insulating layers 601, the second seed patterns 635, the second redistribution patterns 630, the second seed pads 655, and the second redistribution pads 650.

Figure 6I:
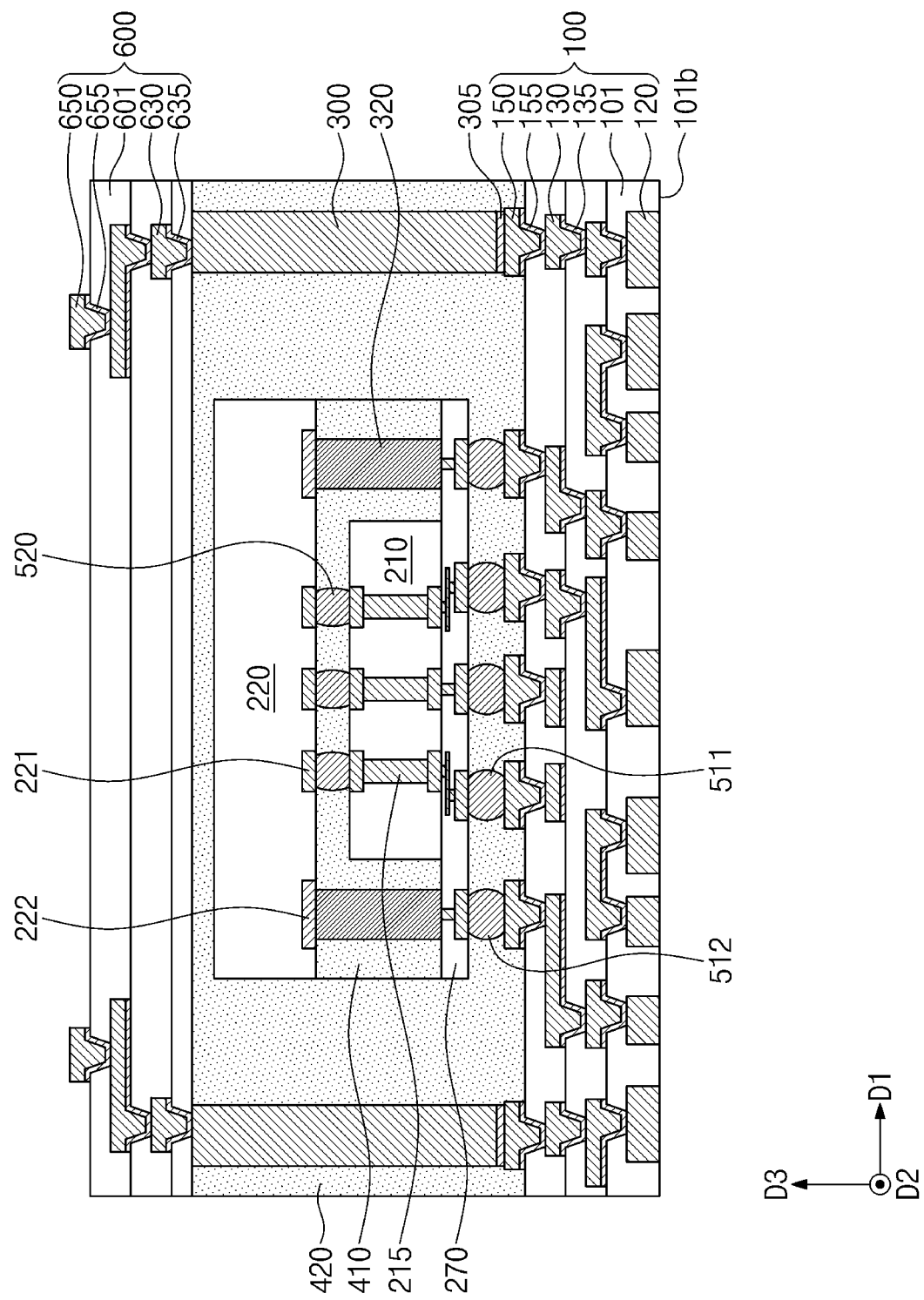

Referring to FIG. 6I, the carrier substrate 900 may be removed to expose a bottom surface 101*b* of the first redistribution substrate 100. For example, bottom surfaces of a lowermost first insulating layer 101 and of the under bump patterns 120 may be exposed.

Referring again to FIG. 1A, solder balls 500 may be formed on the bottom surfaces of the under bump patterns 120 and may be connected to the under bump patterns 120, respectively. The semiconductor package 10 may be manufactured by the processes described in the above embodiments.

The method of manufacturing a single semiconductor package 10 has been described and illustrated in the above embodiments with reference to FIGS. 6A-6I for the purpose of ease and convenience in explanation and illustration. However, a method of manufacturing a semiconductor package according to the inventive concepts is not limited to a chip level. For example, the semiconductor package 10 may be manufactured in a chip level, a panel level or a wafer level.

According to the embodiments of the inventive concepts, the first semiconductor chip and the conductive post may be disposed on the top surface of the first redistribution substrate. The second semiconductor chip may be disposed on the top surface of the first semiconductor chip and the top surface of the conductive post and may be electrically connected to the conductive post. The passive device may be disposed on the bottom surface of the first redistribution substrate so as to be electrically connected to the conductive post through the first redistribution substrate. A voltage may be supplied from the passive device to the second semiconductor chip through the conductive post. Since the conductive post vertically overlaps with the passive device and the second semiconductor chip, a length of a voltage supply path between the passive device and the second semiconductor chip may be reduced. Accordingly, reliability and power integrity of the semiconductor package may be increased.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor package comprising:
a first redistribution substrate;
a passive device mounted on a bottom surface of the first redistribution substrate;
a first semiconductor chip disposed on a top surface of the first redistribution substrate, the first semiconductor chip comprising a through via disposed therein;
a second semiconductor chip disposed on the first semiconductor chip;
a conductive post disposed between the top surface of the first redistribution substrate and a bottom surface of the second semiconductor chip, wherein the conductive post is spaced apart from the first semiconductor chip;
a lower redistribution layer disposed on a bottom surface of the first semiconductor chip and a bottom surface of the conductive post; and
one or more bumps disposed between the first redistribution substrate and the lower redistribution layer,
wherein the conductive post is electrically connected to the first redistribution substrate and to the second semiconductor chip,
wherein the conductive post overlaps with at least a portion of the passive device in a vertical direction normal to the top surface of the first redistribution substrate, and
wherein the conductive post directly contacts a pad that is disposed within the second semiconductor chip.

2. The semiconductor package of claim 1, wherein a width of the conductive post is greater than a width of the through via.

3. The semiconductor package of claim 2, wherein the width of the conductive post is 30 µm to 200 µm.

4. The semiconductor package of claim 1, further comprising:
a connection structure disposed on the top surface of the first redistribution substrate and spaced apart from the second semiconductor chip,
wherein a top surface of the connection structure is located at a same level or at a higher level than a top surface of the second semiconductor chip.

5. The semiconductor package of claim 4, further comprising:
a first molding layer disposed on the bottom surface of the second semiconductor chip and at least partially covering a side surface of the first semiconductor chip and a side surface of the conductive post; and
a second molding layer disposed on the top surface of the first redistribution substrate and at least partially covering a side surface of the connection structure, a side surface of the first molding layer, and the second semiconductor chip.

6. The semiconductor package of claim 5,
wherein the lower redistribution layer is disposed on a bottom surface of the first molding layer.

7. The semiconductor package of claim 1, wherein the conductive post is electrically connected to the passive device through the first redistribution substrate.

8. The semiconductor package of claim 1, further comprising:
one or more solder balls disposed on the bottom surface of the first redistribution substrate,
wherein the passive device is spaced apart from the one or more solder balls.

9. The semiconductor package of claim 8, wherein a bottom surface of the passive device is located at a higher level than bottom surfaces of the one or more solder balls.

10. The semiconductor package of claim 1, wherein a distance between a top surface of the conductive post and a top surface of the passive device is 50 µm to 1000 µm.

11. A semiconductor package comprising:
a first redistribution substrate having a top surface and a bottom surface opposite to the top surface;
a passive device disposed on the bottom surface of the first redistribution substrate;

a first semiconductor chip disposed on the top surface of the first redistribution substrate, the first semiconductor chip comprising a through via disposed therein;

a conductive post disposed on the top surface of the first redistribution substrate and spaced apart from the first semiconductor chip;

a second semiconductor chip disposed on a top surface of the first semiconductor chip and on a top surface of the conductive post, wherein the second semiconductor chip is connected to the through via and wherein the second semiconductor chip includes a pad disposed therein that directly contacts the conductive post;

a lower redistribution layer disposed on a bottom surface of the first semiconductor chip and a bottom surface of the conductive post; and one or more bumps disposed between the first redistribution substrate and the lower redistribution layer, wherein the conductive post is electrically connected to the passive device through the first redistribution substrate, and wherein a width of the conductive post is greater than a width of the through via.

12. The semiconductor package of claim 11, wherein the conductive post vertically overlaps with the passive device.

13. The semiconductor package of claim 11, wherein the conductive post is configured to be supplied with a voltage, and wherein the voltage is a power voltage or a ground voltage.

14. The semiconductor package of claim 11, further comprising:

a solder ball disposed on the bottom surface of the first redistribution substrate and spaced apart from the passive device, wherein the solder ball is electrically connected to the passive device through the first redistribution substrate.

15. The semiconductor package of claim 11, further comprising:

a connection structure disposed on the top surface of the first redistribution substrate and spaced apart from a side surface of the first semiconductor chip and a side surface of the second semiconductor chip; and a molding layer disposed on the top surface of the first redistribution substrate and at least partially covering the side surface of the second semiconductor chip and a side surface of the connection structure.

16. A semiconductor package comprising:

a first redistribution substrate comprising a first insulating layer, a first seed pattern, and a first conductive pattern on the first seed pattern, the first insulating layer including a photosensitive polymer;

a solder ball disposed on a bottom surface of the first redistribution substrate;

a passive device disposed on the bottom surface of the first redistribution substrate and spaced apart from the solder ball;

a first semiconductor chip provided on a top surface of the first redistribution substrate, the first semiconductor chip comprising through vias disposed therein;

a conductive post disposed on the top surface of the first redistribution substrate and spaced apart from the first semiconductor chip;

a second semiconductor chip disposed on a top surface of the first semiconductor chip and on a top surface of the conductive post, wherein the second semiconductor chip is connected to the through vias and directly contacts and the conductive post through a pad that is disposed within the second semiconductor chip;

a first molding layer disposed on a bottom surface of the second semiconductor chip and at least partially covering a side surface of the first semiconductor chip and a side surface of the conductive post;

a connection structure disposed on the top surface of the first redistribution substrate and spaced apart from the first semiconductor chip, the conductive post, the first molding layer, and the second semiconductor chip;

a second molding layer disposed on the top surface of the first redistribution substrate and at least partially covering a side surface of the connection structure, the first molding layer, the second semiconductor chip;

a lower redistribution layer disposed on a bottom surface of the first semiconductor chip and a bottom surface of the conductive post; and one or more bumps disposed between the first redistribution substrate and the lower redistribution layer.

17. The semiconductor package of claim 16, wherein the conductive post overlaps with at least a portion of the passive device in a vertical direction normal to the top surface of the first redistribution substrate.

18. The semiconductor package of claim 16, further comprising:

a second redistribution substrate disposed on the second molding layer and the connection structure, wherein the second redistribution substrate is connected to the connection structure.

19. The semiconductor package of claim 18, further comprising:

an upper package mounted on the second redistribution substrate, wherein the upper package comprises an upper semiconductor chip and an upper molding layer.

20. The semiconductor package of claim 16, wherein a top surface of the connection structure is located at a higher level than a top surface of the second semiconductor chip and at a higher level than the top surface of the conductive post, wherein the top surface of the conductive post is located at a higher level than the top surface of the first semiconductor chip, and wherein a bottom surface of the conductive post is coplanar with a bottom surface of the first molding layer and coplanar with a bottom surface of the first semiconductor chip.

* * * * *